US012271668B1

(12) United States Patent
Bhattacharya et al.

(10) Patent No.: US 12,271,668 B1
(45) Date of Patent: Apr. 8, 2025

(54) FINDING EQUIVALENT CLASSES OF HARD DEFECTS IN STACKED MOSFET ARRAYS

(71) Applicant: Synopsys, Inc., Sunnyvale, CA (US)

(72) Inventors: Mayukh Bhattacharya, Palo Alto, CA (US); Michal Jerzy Rewienski, Gdansk (PL); Shan Yuan, San Jose, CA (US); Michael Durr, Livermore, CA (US); Chih Ping Antony Fan, Saratoga, CA (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 18/370,339

(22) Filed: Sep. 19, 2023

Related U.S. Application Data

(63) Continuation of application No. 17/400,360, filed on Aug. 12, 2021, now Pat. No. 11,797,737, which is a continuation-in-part of application No. 17/221,175, filed on Apr. 2, 2021, now abandoned.

(60) Provisional application No. 63/004,276, filed on Apr. 2, 2020.

(51) Int. Cl.
*G06F 30/33* (2020.01)
*G06F 30/327* (2020.01)

(52) U.S. Cl.
CPC ............ *G06F 30/33* (2020.01); *G06F 30/327* (2020.01)

(58) Field of Classification Search
USPC ...................................................... 716/103
See application file for complete search history.

(56) References Cited

U.S. PATENT DOCUMENTS

| 6,295,627 B1* | 9/2001 | Gowni ..................... G06F 30/30 716/104 |
| 2002/0144219 A1* | 10/2002 | Zachariah ............. G06F 30/398 716/52 |
| 2006/0054959 A1* | 3/2006 | Mauder ................... H01L 28/82 257/E21.651 |
| 2007/0172966 A1* | 7/2007 | Hyde ................. G01R 31/2884 438/14 |
| 2010/0115485 A1* | 5/2010 | Nonaka ................... G06F 30/30 716/119 |

(Continued)

OTHER PUBLICATIONS

Williams, T.W., et al., "Defect Level as a Function of Fault Coverage," IEEE Transactions on Computers, vol. C-30, No. 12, Dec. 1981; pp. 987-988.

*Primary Examiner* — Mohammed Alam
(74) *Attorney, Agent, or Firm* — Lowenstein Sandler LLP

(57) ABSTRACT

This disclosure describes a method for finding equivalent classes of hard defects in a stacked MOSFET array. The method includes identifying the stacked MOSFET array in a circuit netlist. The stacked MOSFET array includes standard MOSFETs sharing gate and bulk terminals. The method further includes determining electrical defects for the standard MOSFETs, grouping the electrical defects into at least one intermediate equivalent defect class based on a topological equivalence of the electrical defects, grouping the electrical defects in the at least one intermediate equivalent defect class into at least one final equivalent defect class based on an electrical equivalence of the electrical defects, performing a defect simulation on an electrical defect in the at least one final equivalent defect class, and attributing a result of the defect simulation on the electrical defect to additional electrical defects in the final equivalent defect class.

20 Claims, 21 Drawing Sheets

(56) References Cited

U.S. PATENT DOCUMENTS

| | | | |
|---|---|---|---|
| 2019/0103269 A1* | 4/2019 | Freund | H01L 21/02266 |
| 2021/0312113 A1* | 10/2021 | Bhattacharya | G06F 30/3323 |
| 2021/0374313 A1* | 12/2021 | Bhattacharya | G06F 30/327 |

* cited by examiner

FINDING EQUIVALENT CLASSES OF HARD DEFECTS IN STACKED MOSFET ARRAYS

CROSS-REFERENCE TO RELATED APPLICATIONS

The present application is a continuation of U.S. patent application Ser. No. 17/400,360, filed on Aug. 12, 2021, titled "Finding Equivalent Classes of Hard Defects in Stacked MOSFET Arrays," which is a continuation-in-part of U.S. patent application Ser. No. 17/221,175, filed on Apr. 2, 2021, titled "A Method for Finding Equivalent Classes of Hard Defects in Stacked MOSFET Arrays," which claims the benefit of U.S. Provisional Patent Application No. 63/004,276, titled "A Method for Finding Equivalent Classes of Hard Defects in Stacked MOSFET Arrays," filed on Apr. 2, 2020. The aforementioned applications are incorporated by reference in their entireties for all purposes.

TECHNICAL FIELD

The present disclosure relates to metal oxide field-effect transistor (MOSFET) arrays.

BACKGROUND

Digital fault simulation, testing, design-for-testability, etc., have matured to such a level that chances of failure in digital component are lower than in the analog component in mixed-signal integrated circuits (ICs). Properly assessing test coverage for analog circuits necessitates accurate and reasonably fast analog fault simulation capability.

SUMMARY

This disclosure describes a method for finding equivalent classes of hard defects in stacked MOSFET arrays. The method includes identifying a stacked MOSFET array in a circuit netlist. The stacked MOSFET array includes multiple standard MOSFETs sharing gate and bulk terminals. The method further includes determining electrical defects for the multiple standard MOSFETs in the stacked MOSFET array, grouping the electrical defects into at least one intermediate equivalent defect class based on a topological equivalence of the electrical defects in the stacked MOSFET array, grouping the electrical defects in the at least one intermediate equivalent defect class into at least one final equivalent defect class based on an electrical equivalence of the electrical defects in the stacked MOSFET array, performing, by a processor, a defect simulation on an electrical defect in the at least one final equivalent defect class, and attributing a result of the defect simulation on the electrical defect to an additional electrical defect in the at least one final equivalent defect class.

This disclosure also describes a system to find equivalent classes of hard defects in stacked MOSFET arrays. The system includes a memory storing instructions and a processor coupled with the memory and to execute the instructions. The instructions when executed cause the processor to identify a stacked MOSFET array in a circuit netlist. The stacked MOSFET array includes multiple standard MOSFETs sharing gate and bulk terminals. The instructions further cause the processor to determine electrical defects for the plurality of standard MOSFETs in the stacked MOSFET array, group the electrical defects into at least one intermediate equivalent defect class based on a topological equivalence of the electrical defects in the stacked MOSFET array, group the electrical defects in the at least one intermediate equivalent defect class into at least one final equivalent defect class based on an electrical equivalence of the electrical defects in the stacked MOSFET array, perform a defect simulation on an electrical defect in the at least one final equivalent defect class, and attribute a result of the defect simulation on the electrical defect to an additional electrical defect in the at least one final equivalent defect class.

This disclosure also describes a non-transitory computer readable medium comprising stored instructions to find equivalent classes of hard defects in stacked MOSFET arrays. The instructions, when executed by a processor, cause the processor to identify a stacked MOSFET array in a circuit netlist. The stacked MOSFET array includes multiple standard MOSFETs sharing gate and bulk terminals. The instructions further cause the processor to determine electrical defects for the plurality of standard MOSFETs in the stacked MOSFET array, group the electrical defects into at least one intermediate equivalent defect class based on a topological equivalence of the electrical defects in the stacked MOSFET array, group the electrical defects in the at least one intermediate equivalent defect class into at least one final equivalent defect class based on an electrical equivalence of the electrical defects in the stacked MOSFET array, perform a defect simulation on an electrical defect in the at least one final equivalent defect class, and attribute a result of the defect simulation on the one electrical defect to an additional electrical defect in the at least one final equivalent defect class.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
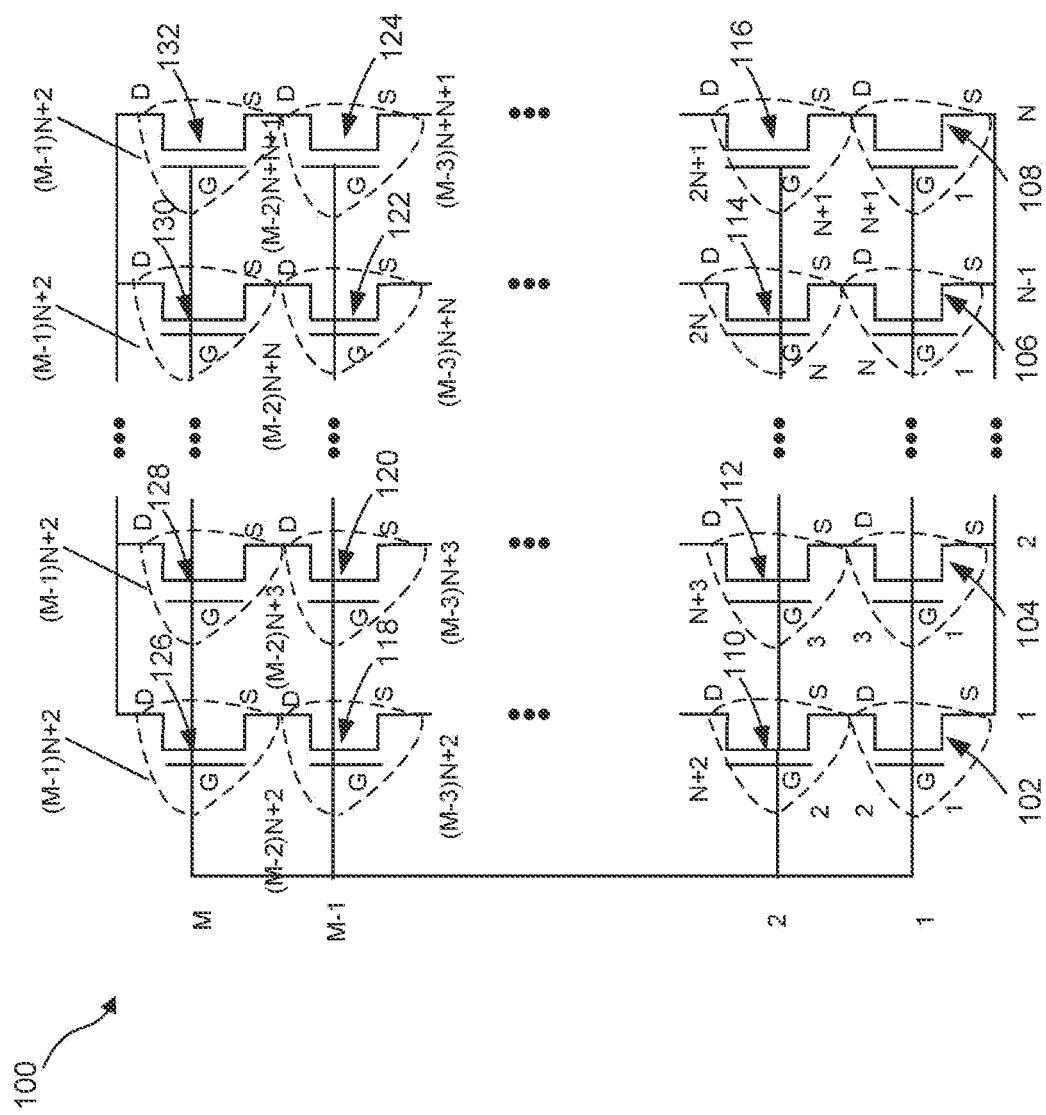
FIG. 1 illustrates short defects in an M*N stacked MOSFET array, according to some embodiments of the present disclosure.

Aspects of the present disclosure relate to a method for finding equivalent classes of hard defects in stacked MOSFET arrays.

In complementary metal-oxide-semiconductor (CMOS) very large-scale integration (VLSI) technology, a designed MOSFET, such as a fin field-effect transistor (FinFET), can achieve a variety of transistor sizes (e.g., width and length) by arranging a number of standard transistors in the form of a stacked MOSFET array with shared gate and bulk terminals. The standard transistors can share a common specification and can be physically and electronically identical. In analog defect simulations, each MOSFET/transistor in a circuit can contribute to the circuit's defect universe and the defect simulation time can significantly increase with the number of MOSFETs in the circuit.

In a mixed signal (e.g., analog and digital) application, as much as 80% of field returns can be attributed to defects in the analog portion of the circuits in the mixed signal application. The defects in this disclosure can refer to electrical defects in a circuit and can include hard defects such as short defects and open defects. Manufacturing test coverage can be related to the number of defective chips returned from the field by $DL=1-Y^{(1-TC)}$ where DL refers to defect level, Y refers to yield, and TC refers to test coverage. Properly assessing test coverage for analog circuits requires accurate and reasonably fast analog defect simulation capability.

In addition, advanced driver-assist systems (ADAS) are becoming ubiquitous in cars and are projected to continue to grow as the automotive industry moves towards totally hands-off-eyes-off autonomous vehicles. Most of the integrated circuits that are critical to the ADAS technologies have significant analog components. Fault simulation of mission-critical circuit components can be used to compute quality metrics recommended by the functional safety standards (e.g., ISO 26262). The quality metrics can include single point fault metric (SPFM), latent fault metric (LFM), probabilistic metric for hardware failures (PMHF), and other quality metrics. Therefore, fast and accurate analog fault simulation (also referred to as "defect simulation") is important for manufacturing test coverage and functional safety.

To perform defect simulation for a circuit, all electrical defects are enumerated. Unlike digital defect simulation where concurrent fault simulation can be algorithmically possible, in analog circuits, the number of defect simulations is equal to the size of the defects if the defects are not analyzed for equivalence It is important to reduce the number of defect simulations and hence the number of unique faults to keep analog defect simulation practical. If two or more defects can be shown to have the same electrical effect, then the two or more defects can be considered to belong to a same equivalent defect class. If a defect in the equivalent defect class is covered by a test then other defects belonging to the equivalent defect class can also be covered by the same test. If a defect in the equivalent defect class is not covered by a test then other defects belonging to the equivalent defect class are not covered by the test. As a result, a defect simulation can be performed for one defect in an equivalent defect class and the result of the defect simulation can be shared with other defects in the equivalent defect class.

Various embodiments in accordance with the present disclosure provide systems and methods to find equivalent classes of electrical defects in a stacked MOSFET array. The stacked MOSFET array can be identified in a circuit netlist and the stacked MOSFET array can include standard MOSFETs sharing gate and bulk terminals. In some embodiments, the standard MOSFETs can share a common specification and can be physically and electronically identical. In some embodiments, the standard MOSFETs can be basic minimum-sized MOSFETs in the circuit netlist. The electrical defects in the stacked MOSFET array can be determined for each standard MOSFET. The electrical defects can be grouped into equivalent defect classes based on topological equivalences and electrical equivalences of the electrical defects. A defect simulation result of one defect in each equivalent defect class can be attribute to other defects in the same equivalent defects class.

Advantages of the present disclosure include, but are not limited to, reducing the total number of defect simulations while maintaining the defect coverage for a stacked MOSFET array. With equivalent defects classes, instead of performing defect simulations on every electrical defect in the stacked MOSFET array, one defect simulation for one defect in each equivalent defect class can cover all defects in the stacked MOSFET array. In some embodiments, the total number of simulations in an M*N stacked MOSFET array can be reduced from an order of O(M*N) to O(1). And the defect coverage based on equivalent defect class can be the same as the defect coverage of defect simulations on all electrical defects.

FIG. 1 illustrates short defects in an M*N stacked MOSFET array 100, according to some embodiments of the present disclosure. In some embodiments, the M*N stacked MOSFET array 100 in FIG. 1 shows the connection of M rows and N columns of standard MOSFETs. The stacked MOSFET array 100 can act as one single transistor electrically, though M*N MOSFETs are physically connected in the circuit layout. In analog circuits, a circuit design can include a variety of transistor sizes. In some of the circuit designs, about 90% of the transistors include arrays of standard transistors.

Since short or open defects can occur on each of the physical transistors, the number of the defects can be large for a small schematic analog design. For example, an operational amplifier (OPAMP) circuit can include about twenty designed transistors with different sizes. However, to achieve the desired size for each designed transistor, an array of standard transistors could be used for each designed transistor. The array of standard transistors can include hundreds of or thousands of standard transistors, which can significantly increase the number of defects for each designed transistor.

Prior to analyzing electrical defects in an electrical circuit, a stacked MOSFET array can be identified in a circuit netlist (e.g., in the formats of SPICE™, SPECTRE™, or ELDO™). Identifying the stacked MOSFET array in the circuit netlist can include operations of: (1) identifying groups of MOSFETs sharing common gate and bulk terminals independent of a hierarchical netlist representation of the electrical circuit; (2) further dividing the identified groups of MOSFETs into groups of standard MOSFETs; and (3) for each group of standard MOSFETs sharing comment gate and bulk terminal: (a) identifying strings of serially connected MOSFETs and replacing each string with a wrapper MOSFET, where a number of standard MOSFETs in each wrapper MOSFET can represent a row index of the stacked MOSFET array; (b) grouping the wrapper MOSFETs with shared terminals and with the same row index into the stacked MOSFET array, where a number of the wrapper MOSFETs can represent a column index of the stacked MOSFET array. The identified stacked MOSFET array can include the standard MOSFETs sharing common gate and bulk terminals and a stack index of the stacked MOSFET array can be determined by the row index and the column index.

Figure 2:
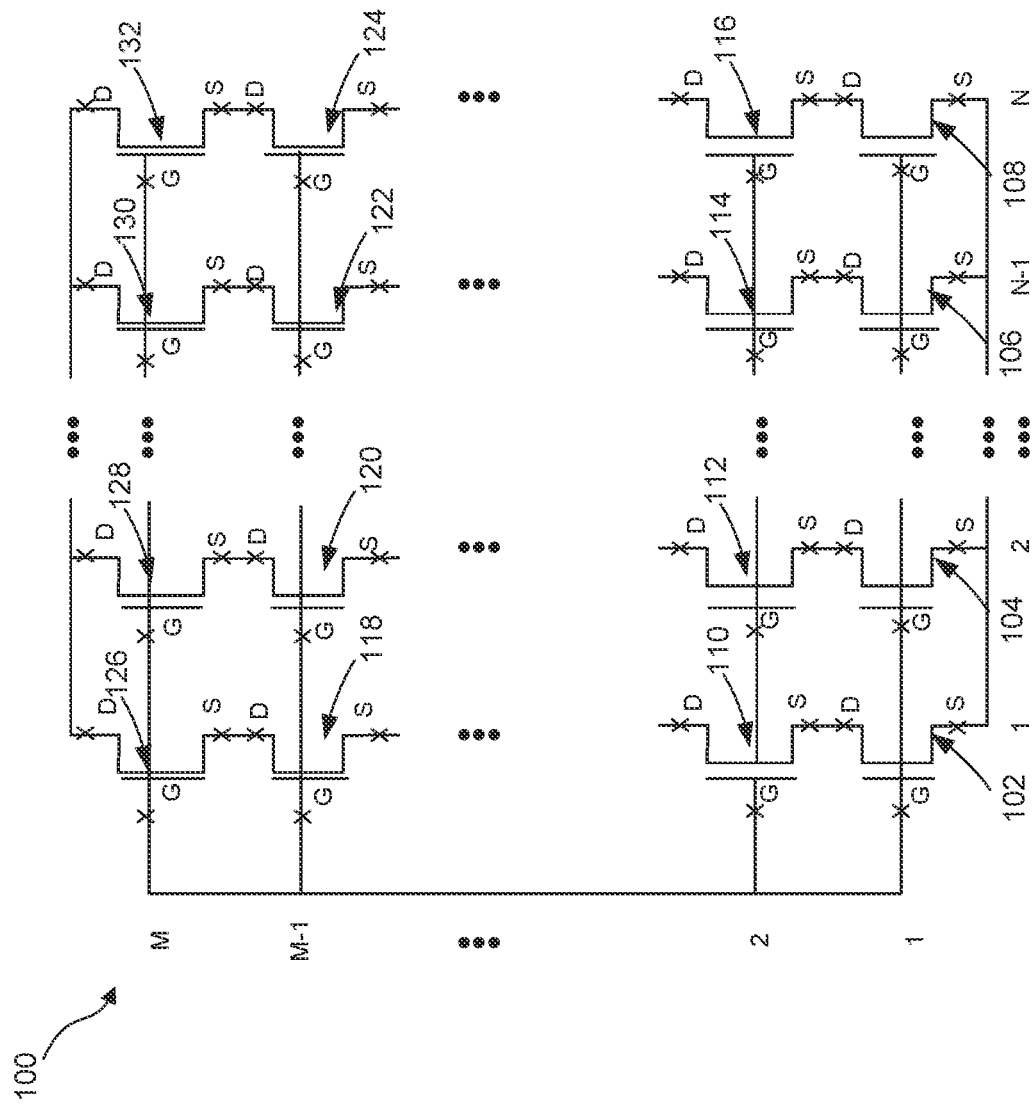
FIG. 2 illustrates open defects in an M*N stacked MOSFET array, according to some embodiments of the present disclosure.

In an analog circuit, hard defects of a MOSFET of the analog circuit can include two types: short defects between two terminals of the MOSFET and open defects at each terminal of the MOSFET. A standard MOSFET device can have four terminals: drain, gate, source, and bulk. Therefore, the standard MOSFET can have six short defects and four open defects. If a stacked MOSFET array includes M rows and N columns of standard MOSFETs, a completely enumeration of hard defects of the stacked MOSFET array can be M*N*(6+4)=10*M*N. However, all the MOSFETs in the stacked array have their gate terminals connected to a same circuit node, and in each column a source terminal of one MOSFET is connected to a drain terminal of an adjacent MOSFET. As a result, some of the 10*M*N defects is related to shared terminals and can be a same defect for different MOSFET terminals. The same defect for different MOSFET terminals can be referred to as topologically equivalent defects. In some embodiments, short and open defects for a bulk terminal of a MOSFET may not be considered. Therefore, the hard defects associated with the MOSFET can include three short defects and three open defects for source, drain, and gate terminals. Though three terminal for each MOSFET are shown in FIGS. 1 and 2, identifying topologically equivalent defects can be applied to any number of terminals for each MOSFET.

Referring to FIG. 1, M*N stacked MOSFET array 100 can include M*N standard MOSFETs, such as MOSFETs 102-132. Each MOSFET can include drain (D), gate (G), and source (S) terminals. The arcs between different terminals can illustrate short defects between these different terminals. The short defects for each MOSFET in stacked MOSFET array 100 can include gate-drain short defects, gate-source short defects, and drain-source short defects. As shown in FIG. 1, two short defects can be topologically and hence electrically equivalent if two terminals are shorted by both of the two short defects and the short resistances of the two short defects are the same. For example, gate-source short defects of MOSFETs 102-108 are topologically equivalent as the shared gate and shared source terminals of MOSFETs 102-108 are shorted by each of the gate-source short defects. Similarly, gate-drain short defect of MOSFET 102 and gate-source short defect of MOSFET 110 are topologically equivalent as the shared gate terminal and shared drain/source terminal are shorted by both of the defects. The numbers next to each short defect in FIG. 1 can illustrate topologically equivalent gate-source and gate-drain short defects for stacked MOSFET array 100.

As each MOSFET in stacked MOSFET array 100 can have three short defects, the total number of short defects in stacked MOSFET array 100 can be 3*M*N. Between two adjacent rows in each column, the gate-source/drain short defects can be topologically equivalent, such as gate-drain short defect of MOSFET 102 and gate-source short defect of MOSFET 110. Since stacked MOSFET array 100 includes M rows, (M−1)*N gate-source/drain short defects can be counted twice. Similarly, the gate-drain short defects of all MOSFETs in the top row M can be topologically equivalent, and the gate-source short defects of all MOSFETs in bottom row 1 can be topologically equivalent. As a result, 2*N gate-drain and gate-source short defects can be represented by one gate-drain and one gate-source short defects, respectively. A number of topologically equivalent short defects in M*N stacked MOSFET array 100 can be calculated as:

$$3*M*N - ((M-1)*N + 2*N - 2) =$$
$$3*M*N - (M*N + N - 2) = 2*M*N - N + 2$$

The number of topologically equivalent short defects in stacked MOSFET array 100 can be a sum of (M−1)*N+2 shown in FIG. 1 for topologically equivalent gate-source and gate-drain short defects and M*N for drain-source short defects.

In some embodiments, each MOSFET in stacked MOSFET array 100 can share a common specification and can be physically and electronically identical. As two columns of stacked MOSFET array 100 can be swapped with one another without making any electrical difference, additional equivalent short defects can be identified. For example, a source-drain short defect of a MOSFET in one column of stacked MOSFET array 100 can be topologically equivalent to another source-drain short of corresponding MOSFET in the same row in another column. As shown in FIG. 1, the source-drain short defect of MOSFET 102 can be topologically equivalent to the source-drain short defects of MOSFETs 104, 106, and 108 As a result, the number of topologically equivalent short defects in M*N stacked MOSFET array 100 can be reduced to 2*M+1, which is independent of the number of columns.

FIG. 2 illustrates open defects in M*N stacked MOSFET array 100, according to some embodiments of the present disclosure. As shown in FIG. 2, the cross at each terminal can represent corresponding open defects. For example, MOSFET 102 can have gate open defect, drain open defect, and source open defect at gate, drain, and source terminals of MOSFET 102. Open defects of multiple MOSFET terminals that are connected can be equivalent. For example, as shown in FIG. 2, the source terminal of MOSFET 110 is connected to the drain terminal of MOSFET 102. Therefore, the source open defects of MOSFET 110 is topologically and hence electrically equivalent to the drain open defect of MOSFET 102. Topologically equivalent open defects can be represented by one of the open defects. As a result, a number of topologically equivalent open defects for stacked MOSFET array 100 can be calculated as:

$$3*M*N-N*(M-1)=2*M*N+N$$

In some embodiments, each MOSFET in stacked MOSFET array 100 can share a common specification and can be physically and electronically identical. Similar to the short defects, an open defects of a MOSFET in one column of stacked MOSFET array 100 can be topologically equivalent to another open defect of corresponding MOSFET in the same row in a different column. As shown in FIG. 2, the drain open defect of MOSFET 102 can be topologically equivalent to the drain open defects of MOSFETs 104, 106, and 108. As a result, the number of topologically equivalent open defects in M*N stacked MOSFET array 100 can be reduced to 2*M+1, which is independent of the number of columns.

Figure 3:
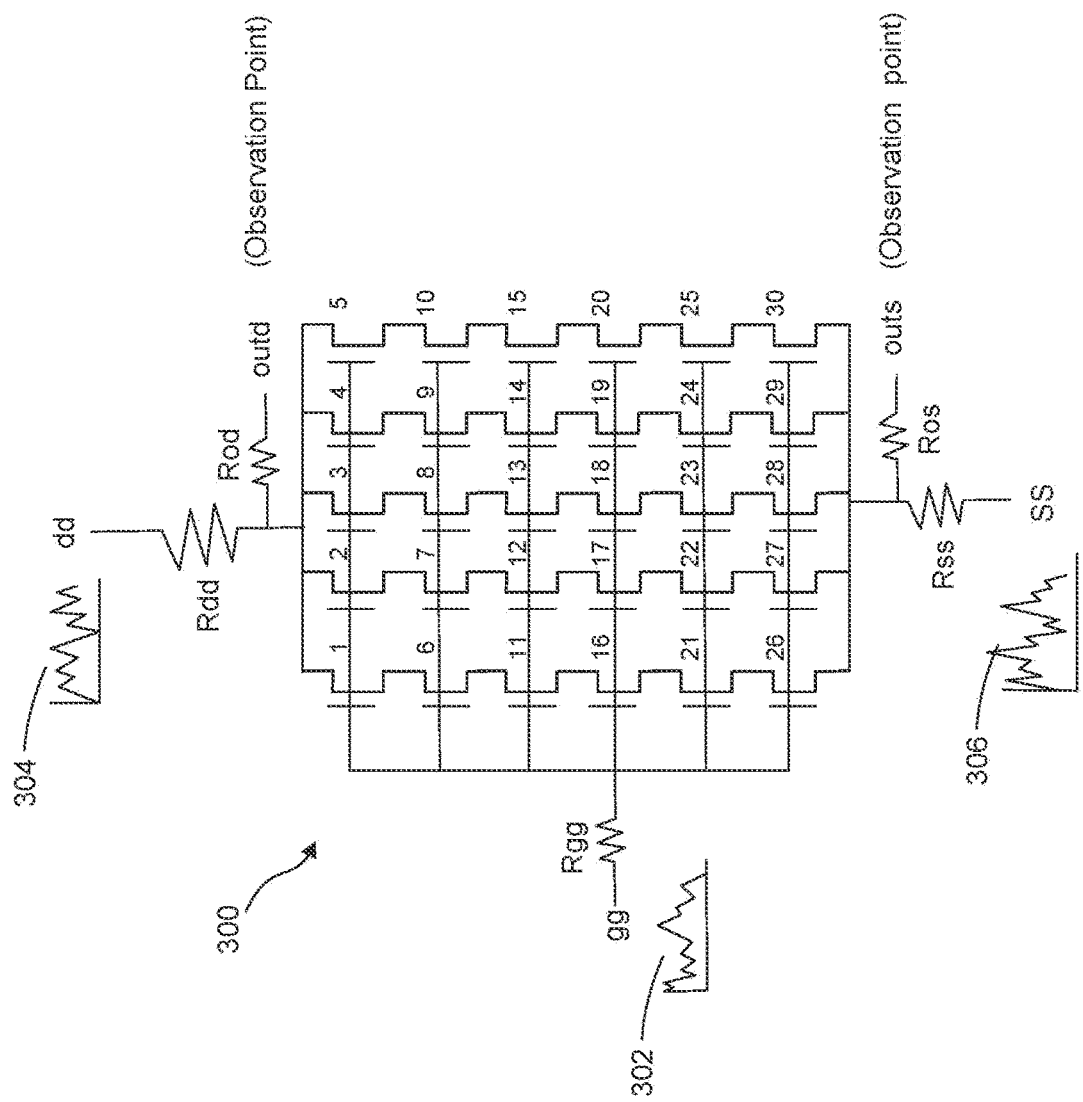
FIG. 3 illustrates a 6*5 stacked MOSFET array for defect simulation experiments, according to some embodiments of the present disclosure.

FIG. 3 illustrates a 6*5 stacked MOSFET array 300 for defect simulation experiments, according to some embodiments of the present disclosure. Stacked MOSFET array 300 can include six rows and five columns of standard MOSFETs constructed with generic level MOS models. As shown in FIG. 3, the MOSFETs in stacked MOSFET array 300 are numbered from 1 to 30. In some embodiments, stacked MOSFET array 300 can be connected to three input terminals dd, gg, and ss through corresponding resistors Rdd, Rgg, and Rss. Profiles 302, 304, and 306 can illustrate input signals at input terminals gg, dd, and ss, respectively. Resistors Rdd, Rgg, and Rss can isolate defect responses in stacked MOSFET array 300 from the input signals and improve the defect simulation. In some embodiments, the resistance of resistors Rdd and Rss in FIG. 3 can be about 1 kΩ. The resistance of resistor Rgg in FIG. 3 can be about 1Ω. The output signals can be observed at output terminals outd and outs. Output terminals outd and outs can include resistors Rod and Ros to improve the defect simulation. In some embodiments, the resistance of resistors Rod and Ros in FIG. 3 can be about 1Ω.

Figure 4:
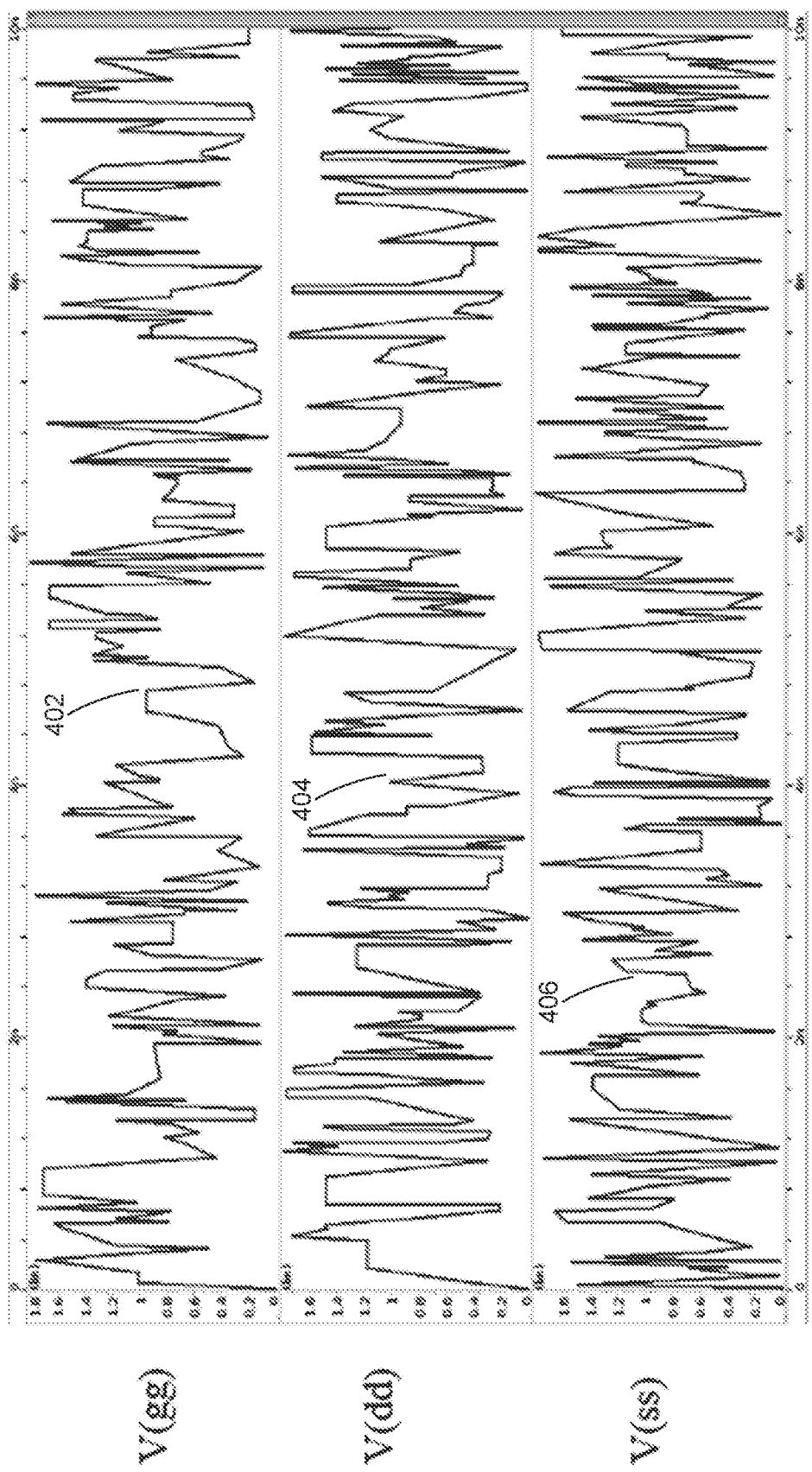
FIG. 4 illustrates input signals to a 6*5 stacked MOSFET array, according to some embodiments of the present disclosure.

In some embodiments, input signals at input terminals dd, gg, and ss can be random piece-wise-linear (PWL) voltage signals that have high and low frequency components to excite a wide frequency range of defect responses in stacked MOSFET array 300. FIG. 4 illustrates input signals to 6*5 stacked MOSFET array 300, according to some embodiments of the present disclosure. As shown in FIG. 4, profiles 402, 404, and 406 can represent input signals at input terminals gg, dd, and ss, which can be PWL voltage signals and can have high and low frequency components for the defect simulation.

Figure 5:
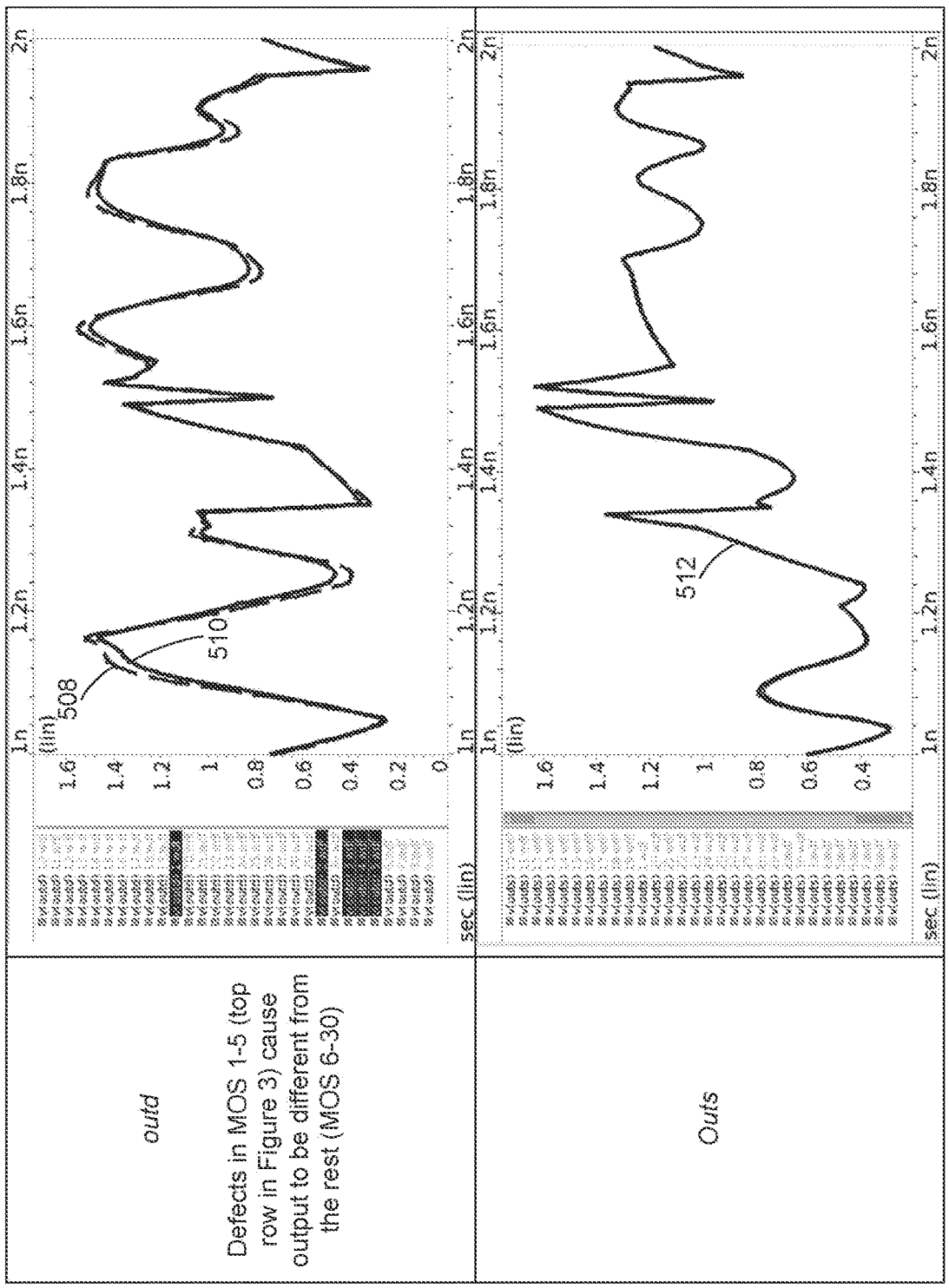
FIG. 5 illustrates output signals for drain open defects on 30 MOSFETs of a 6*5 stacked MOSFET array, according to some embodiments of the present disclosure.

FIGS. 5-10 illustrate output signals at output terminals outd and outs for open and short defects related to drain, gate, and source terminals on 30 MOSFETs of 6*5 stacked MOSFET array 300 shown in FIG. 3, according to some embodiments of the present disclosure. The open and short defects in each of MOSFET 1-30 are simulated and the output signals for each defect at output terminals outd and outs are overlaid together in FIGS. 5-10 to find out electrical equivalent defect classes. MOSFETs with different output signals (e.g., different profiles) are highlighted in FIGS. 5-10. Referring to FIG. 5, profile 508 can represent output signals at output terminal outd for drain open defects in MOSFETs 1-5 and profile 510 can represent output signals at output terminal outd for drain open defects in MOSFETs 6-30. As shown in FIG. 3, MOSFETs 1-5 are adjacent to input terminal dd and are on a top edge row of drain terminals of stacked MOSFET array 300. MOSFETs 6-30 are away from input terminal dd. As shown in FIG. 5, profile 508 is different from profile 510 and profiles 508 and 510 can represent two electrically equivalent drain open defects for MOSFETs 1-30 in stacked MOSFET array 300 at output terminal outd. Similarly, profile 512 can represent one electrically equivalent drain open defect for MOSFETs 1-30 in stacked MOSFET array 300 at output terminal outs.

Figure 6:
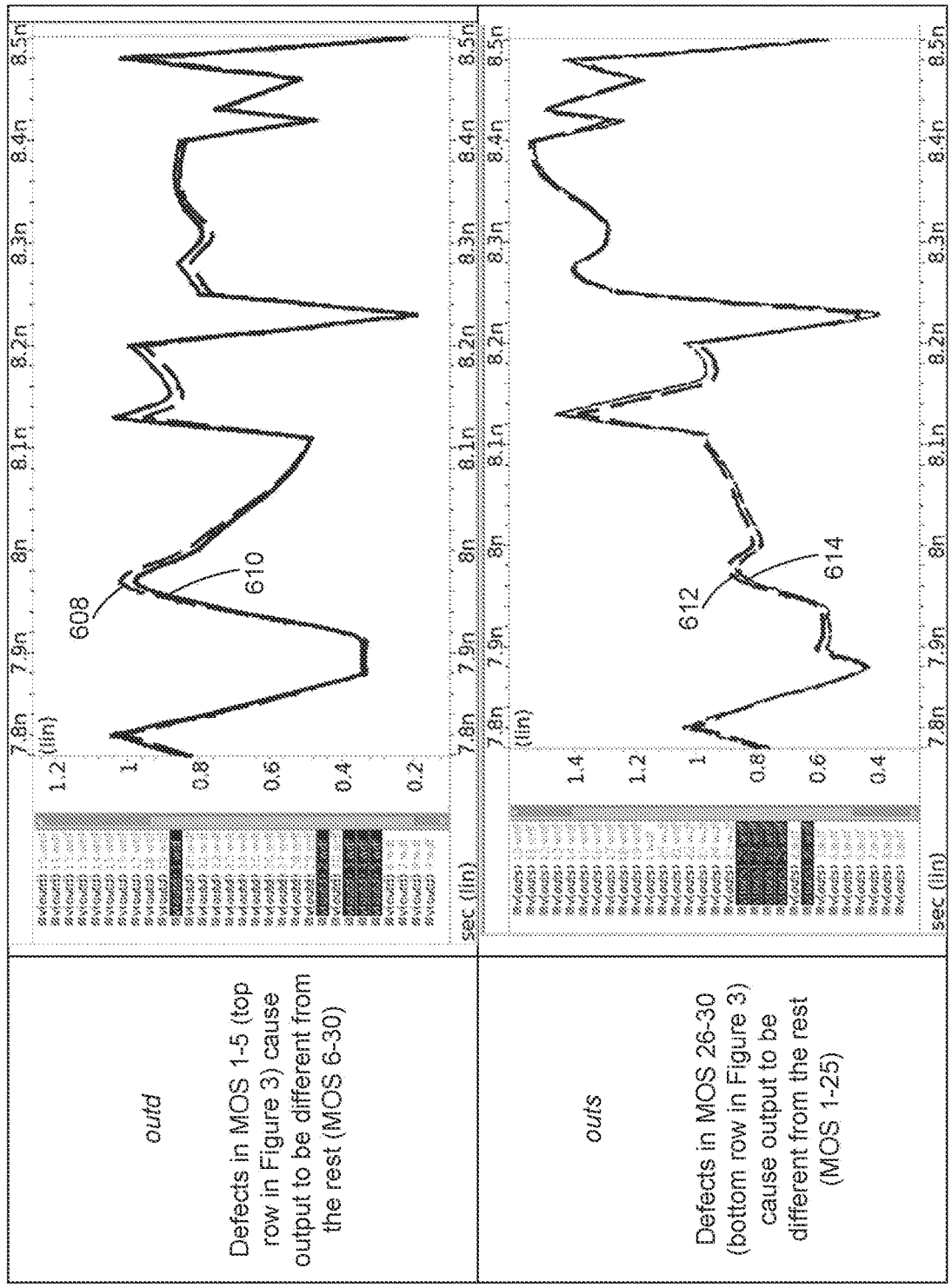
FIG. 6 illustrates output signals for gate open defects on 30 MOSFETs of a 6*5 stacked MOSFET array, according to some embodiments of the present disclosure.

Referring to FIG. 6, profile 608 can represent output signals at output terminal outd for gate open defects in MOSFETs 1-5 and profile 610 can represent output signals at output terminal outd for gate open defects in MOSFETs 6-30. Accordingly, profiles 608 and 610 can represent two electrically equivalent gate open defects for MOSFETs 1-30 in stacked MOSFET array 300 at output terminal outd. Similarly, profile 612 can represent output signals at output terminal outs for gate open defects in MOSFETs 26-30 and profile 614 can represent output signals at output terminal outs for gate open defects in MOSFETs 1-25. Accordingly, profiles 612 and 614 can represent two electrically equivalent gate open defects for MOSFETs 1-30 in stacked MOSFET array 300 at output terminal outs.

Figure 7:
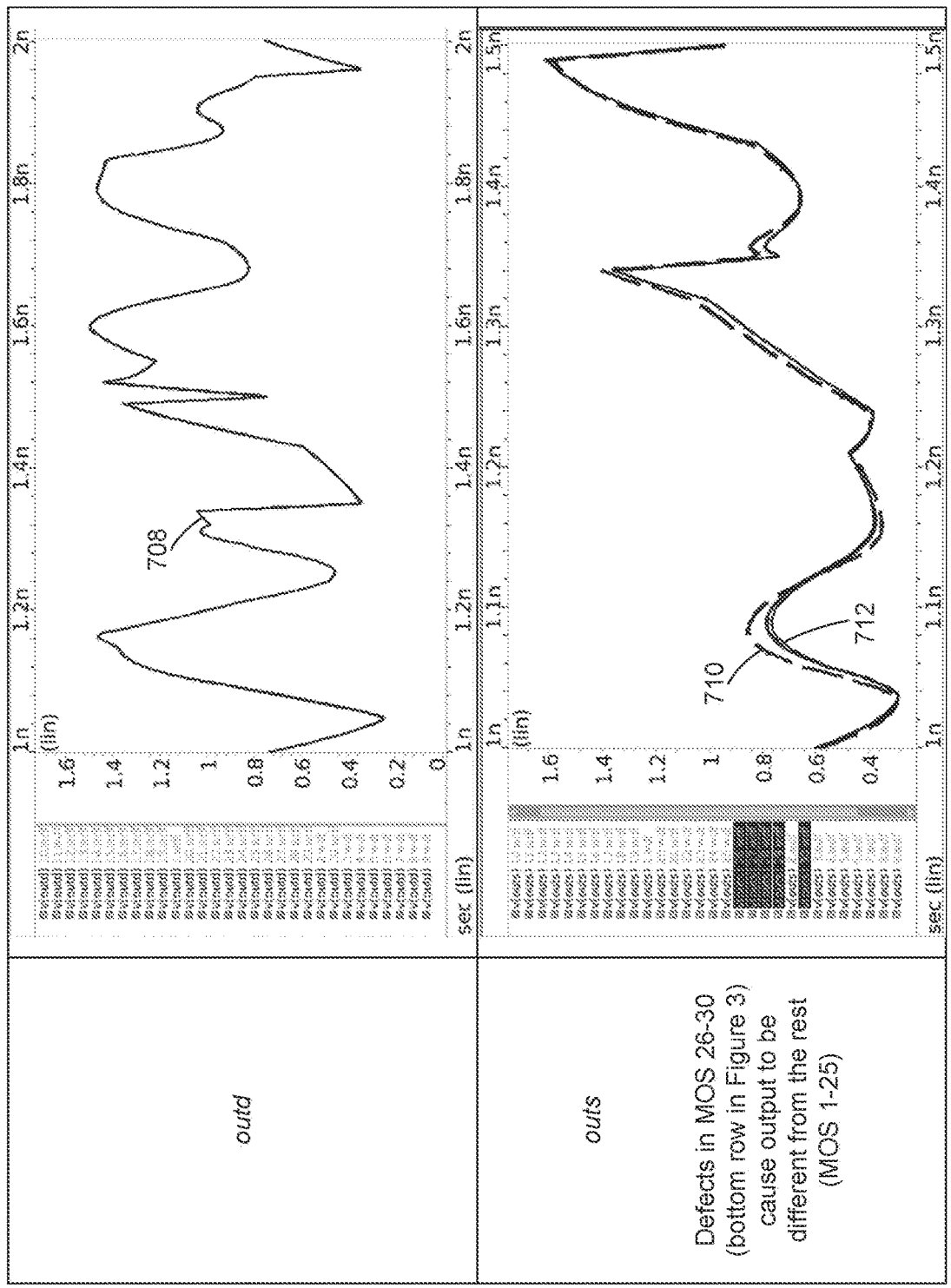
FIG. 7 illustrates output signals for source open defects on 30 MOSFETs of a 6*5 stacked MOSFET array, according to some embodiments of the present disclosure.
Figure 8:
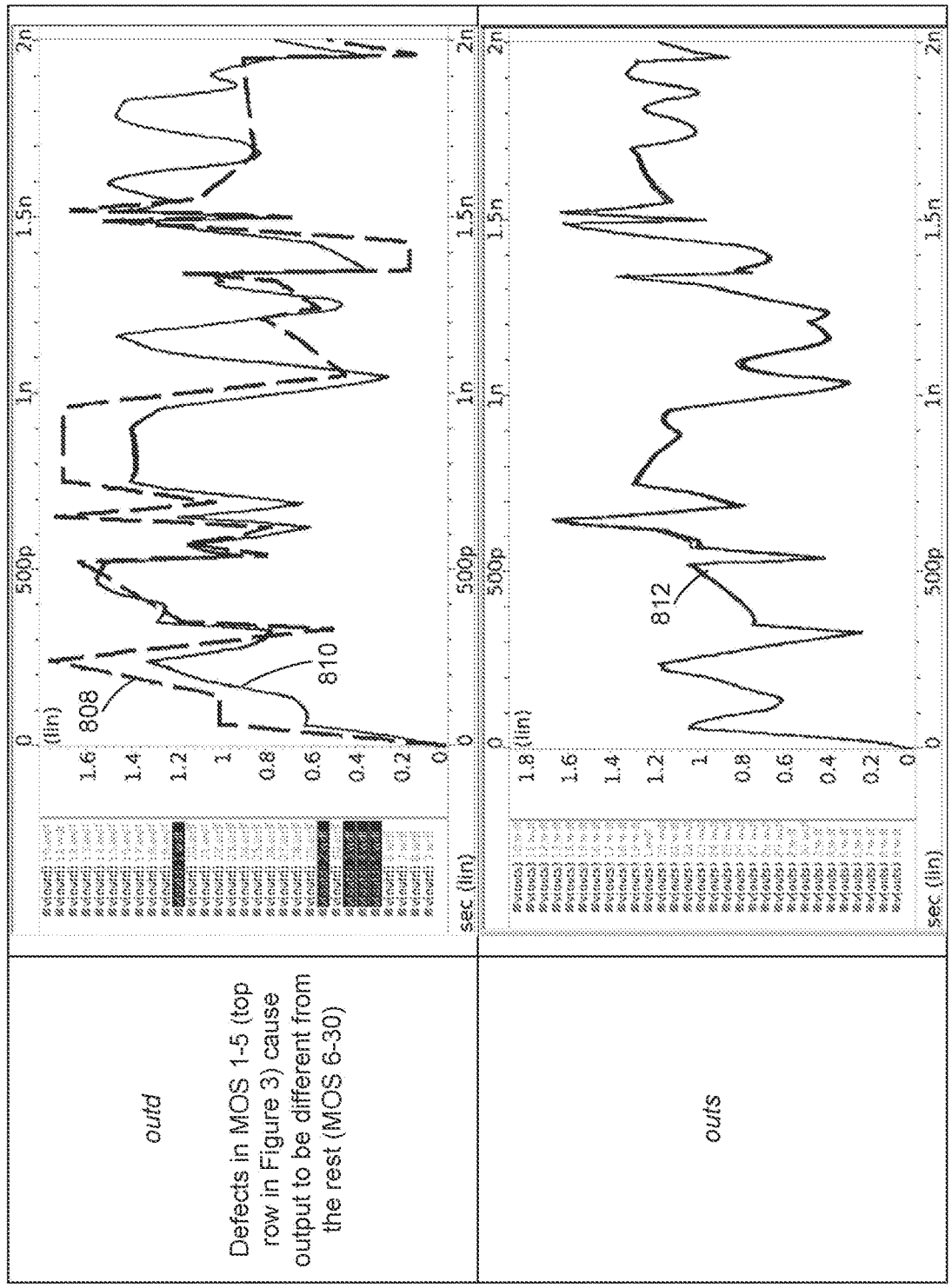
FIG. 8 illustrates output signals for gate-drain short defects on 30 MOSFETs of a 6*5 stacked MOSFET array, according to some embodiments of the present disclosure.
Figure 9:
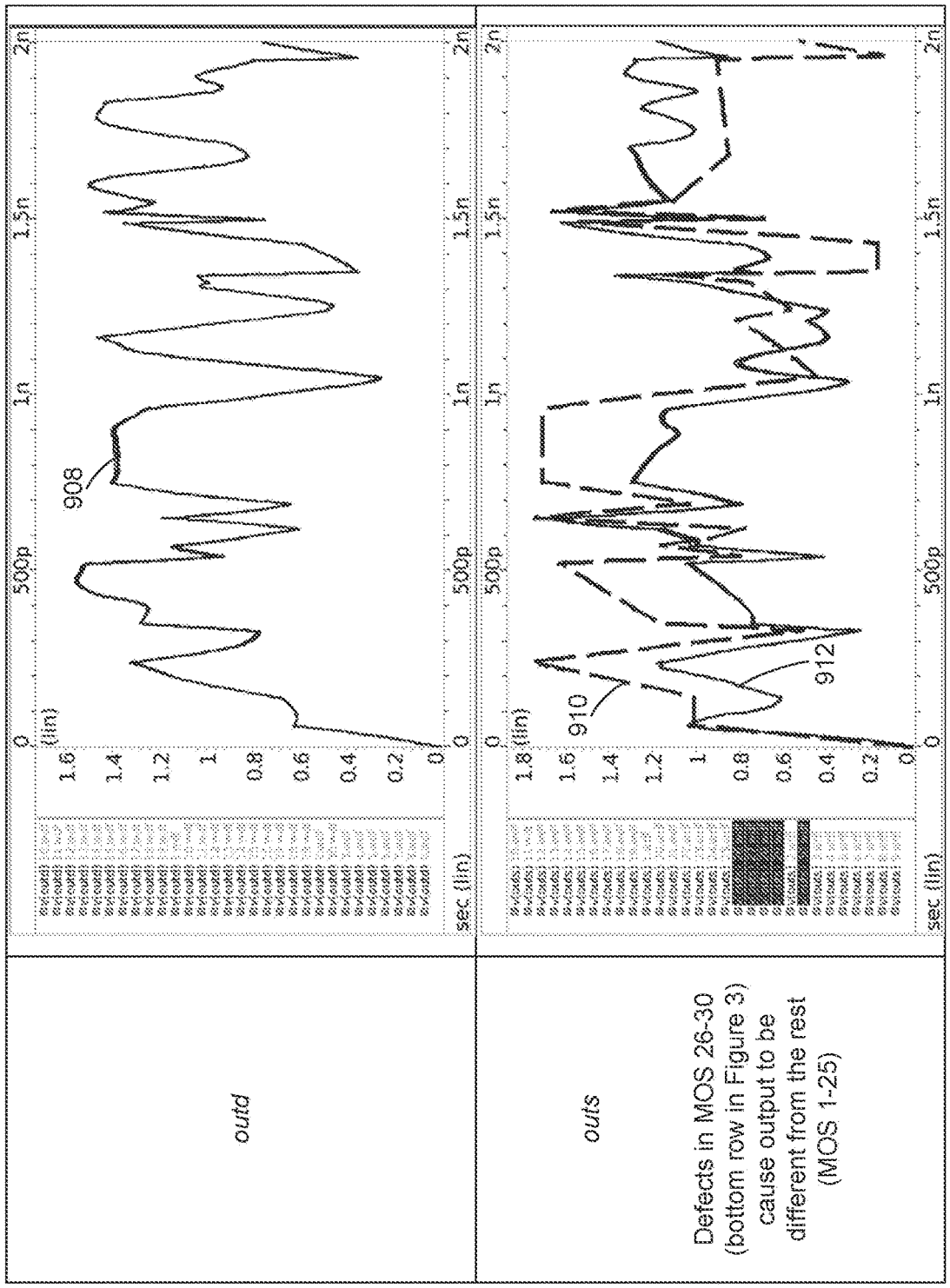
FIG. 9 illustrates output signals for gate-source short defects on 30 MOSFETs of a 6*5 stacked MOSFET array, according to some embodiments of the present disclosure.
Figure 10:
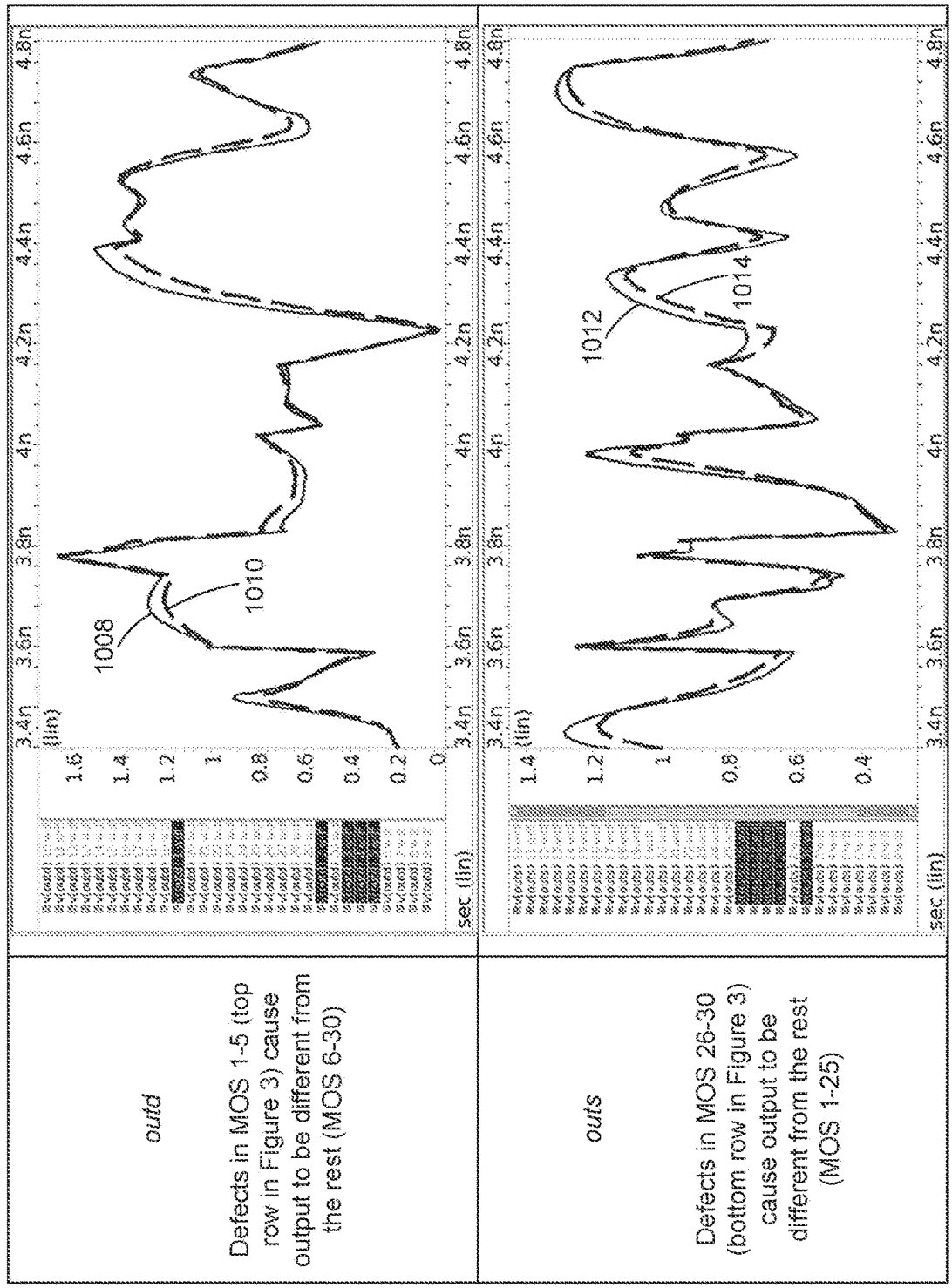
FIG. 10 illustrates output signals for drain-source short defects on 30 MOSFETs of a 6*5 stacked MOSFET array, according to some embodiments of the present disclosure.

Referring to FIG. 7, profile 708 can represent one electrically equivalent source open defects for MOSFETs 1-30 in stacked MOSFET array 300 at output terminal outd. Profiles 710 and 712 can represent two electrically equivalent source open defects for MOSFETs 1-30 in stacked MOSFET array 300 at output terminal outs. Referring to FIG. 8, profiles 808 and 810 can represent two electrically equivalent gate-drain short defects for MOSFETs 1-30 in stacked MOSFET array 300 at output terminal outd. Profile 812 can represent one electrically equivalent gate-drain short defect for MOSFETs 1-30 in stacked MOSFET array 300 at output terminal outs. Referring to FIG. 9, profile 908 can represent one electrically equivalent gate-source short defect for MOSFETs 1-30 in stacked MOSFET array 300 at output terminal outd. Profiles 910 and 912 can represent two electrically equivalent gate-source short defects for MOSFETs 1-30 in stacked MOSFET array 300 at output terminal outs. Referring to FIG. 10, profiles 1008 and 1010 can represent two electrically equivalent drain-source short defects for MOSFETs 1-30 in stacked MOSFET array 300 at output terminal outd. Profiles 1012 and 1014 can represent two electrically equivalent drain-source short defects for MOSFETs 1-30 in stacked MOSFET array 300 at output terminal outs.

FIGS. 5-10 can illustrate that the output signals of open and short defects can be similar for MOSFETs in stacked MOSFET array 300 across different rows except the top edge row and the bottom edge row. In the top and bottom edge rows of stacked MOSFET array 300, open and short defects may affect output terminals outd and outs that are connected to the top and bottom edge rows. As a result, a stacked MOSFET array can have three electrically equivalent defects: (1) defects in MOSFETs in an edge row of drain terminals (also referred to as "drain-edge row MOSFETs") in the stacked MOSFET array connected to an external drain input signal; (2) defects in MOSFETs in an edge row of source terminals (also referred to as "source-edge row MOSFETs") in the stacked MOSFET array connected to an external source input signal; and (3) defects in MOSFETs in the internal rows of the stacked MOSFET array.

Figure 11:
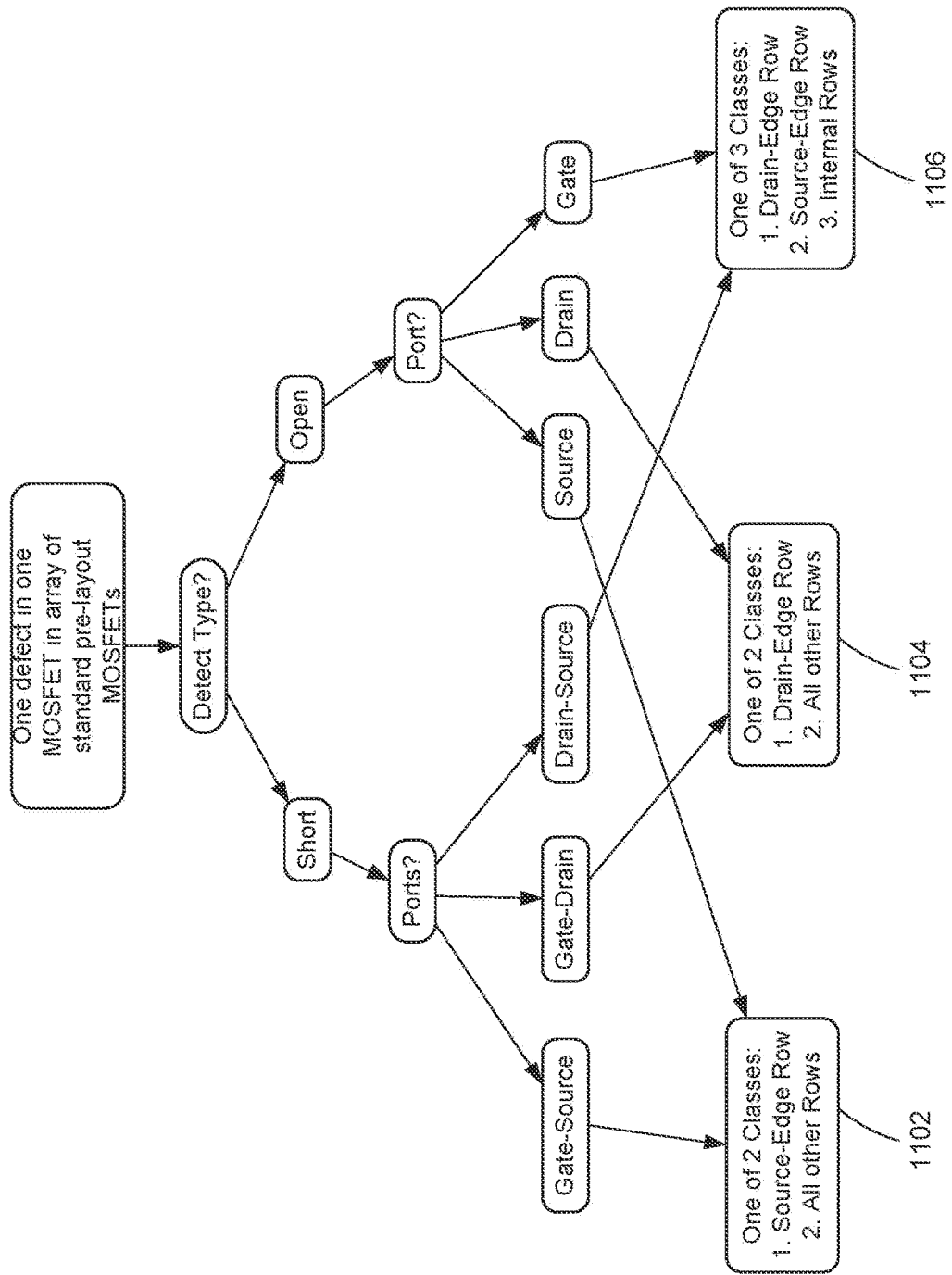
FIG. 11 illustrates a process of finding equivalent class of one defect in a stacked MOSFET array of standard pre-layout MOSFETs, according to some embodiments of the present disclosure.

FIG. 11 illustrates a process of finding equivalent class of one defect in a stacked MOSFET array of standard pre-layout MOSFETs, according to some embodiments of the present disclosure. In some embodiments, FIG. 11 can illustrate a process of equivalence classification for one defect related to gate, drain, and source terminals in a stacked MOSFET array. As shown in FIG. 11, the defect type of the one defect in the stacked MOSFET array can be identified as a short defect or an open defect. For the short and open defects, the related ports can be identified. The equivalent defect classes for a gate-source short defect and a source open defect can be illustrated in box 1102. The equivalent defect classes for a gate-drain short defect and a drain open defect can be illustrated in box 1104. The equivalent defect classes for a drain-source short defect and a gate open defect can be illustrated in box 1106.

In some embodiments, the process to classify defects in a stacked MOSFET array can include: (1) identifying stacked MOSFET arrays; (2) classifying short and open defects into intermediate equivalent defect classes based on topological equivalences shown in FIGS. 1 and 2; and (3) further classifying defects in each intermediate equivalent defect class based on electrical equivalences shown in FIG. 11. The final equivalent defect classes can be shown in boxes 1102, 1104, and 1106 of FIG. 11. For defect simulation of defects in the stacked MOSFET array, one defect in each final equivalent defect class can be simulated. The simulation result of the one defect can be attributed to other defects in corresponding final equivalent defect class. As a result, compared to defect simulation of every defect in the stacked MOSFET array, defect simulation of one defect in each final equivalent defect class can significantly reduce simulation time and maintain defect coverage.

In some embodiments, defects in a stacked MOSFET array can be related to gate, drain, source, and bulk terminals. Referring to FIG. 1, for topologically equivalent short defects related to bulk terminals in M*N stacked MOSFET array 100, row 1 can include N drain-bulk short defects, one gate-bulk short defect, and one source-bulk short defect. From row 2 to row M−1, each row can include N drain-bulk short defects, zero gate-bulk short defect, and zero source-bulk short defect. Row M can include one drain-bulk short defect, zero gate-bulk short defect, and zero source-bulk short defect. As a result, the total number of topologically equivalent short defects related to bulk terminals for stacked MOSFET array 100 can be calculated as:

$$(M-1)*N+1+1=M*N-N+3$$

Referring to FIG. 2, for topologically equivalent open defects related to bulk terminals in M*N stacked MOSFET array 100, each row from row 1 to row M can include N bulk open defects. As a result, the total number of topologically equivalent open defects related to bulk terminals for stacked MOSFET array 100 can be calculated as M*N. In some embodiments, each MOSFET in stacked MOSFET array 100 can share a common specification and can be physically and electronically identical. The total number of topologically equivalent short defects related to bulk terminals for standard MOSFETs in stacked MOSFET array 100 can be reduced to M+2 and the total number of topologically equivalent open defects related to bulk terminals can be reduced to M.

FIGS. 12-15 illustrate output signals at output terminals outd and outs for open and short defects related to drain, gate, source, and bulk terminals on 30 MOSFETs of 6*5 stacked MOSFET array 300 shown in FIG. 3, according to some embodiments of the present disclosure. Similar to FIGS. 5-10, the bulk open and short defects in each of MOSFET 1-30 are simulated and the output signals for each defect at output terminals outd and outs are overlaid together in FIGS. 12-15 to find out electrical equivalent defect classes related to bulk terminals. MOSFETs with different output signals (e.g., different profiles) are highlighted in FIGS. 12-15.

Figure 12:
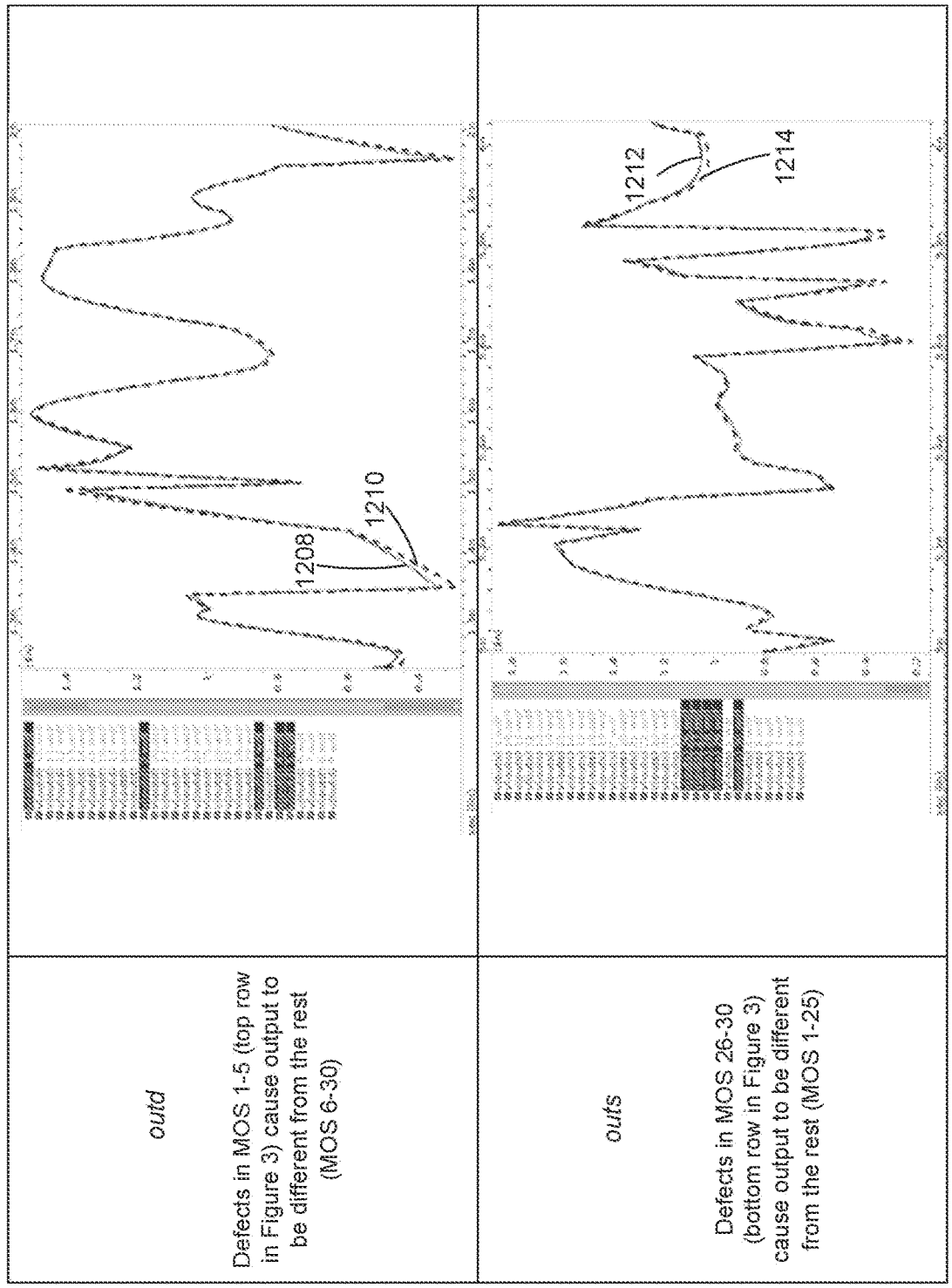
FIG. 12 illustrates output signals for bulk open defects on 30 MOSFETs of a 6*5 stacked MOSFET array, according to some embodiments of the present disclosure.
Figure 13:
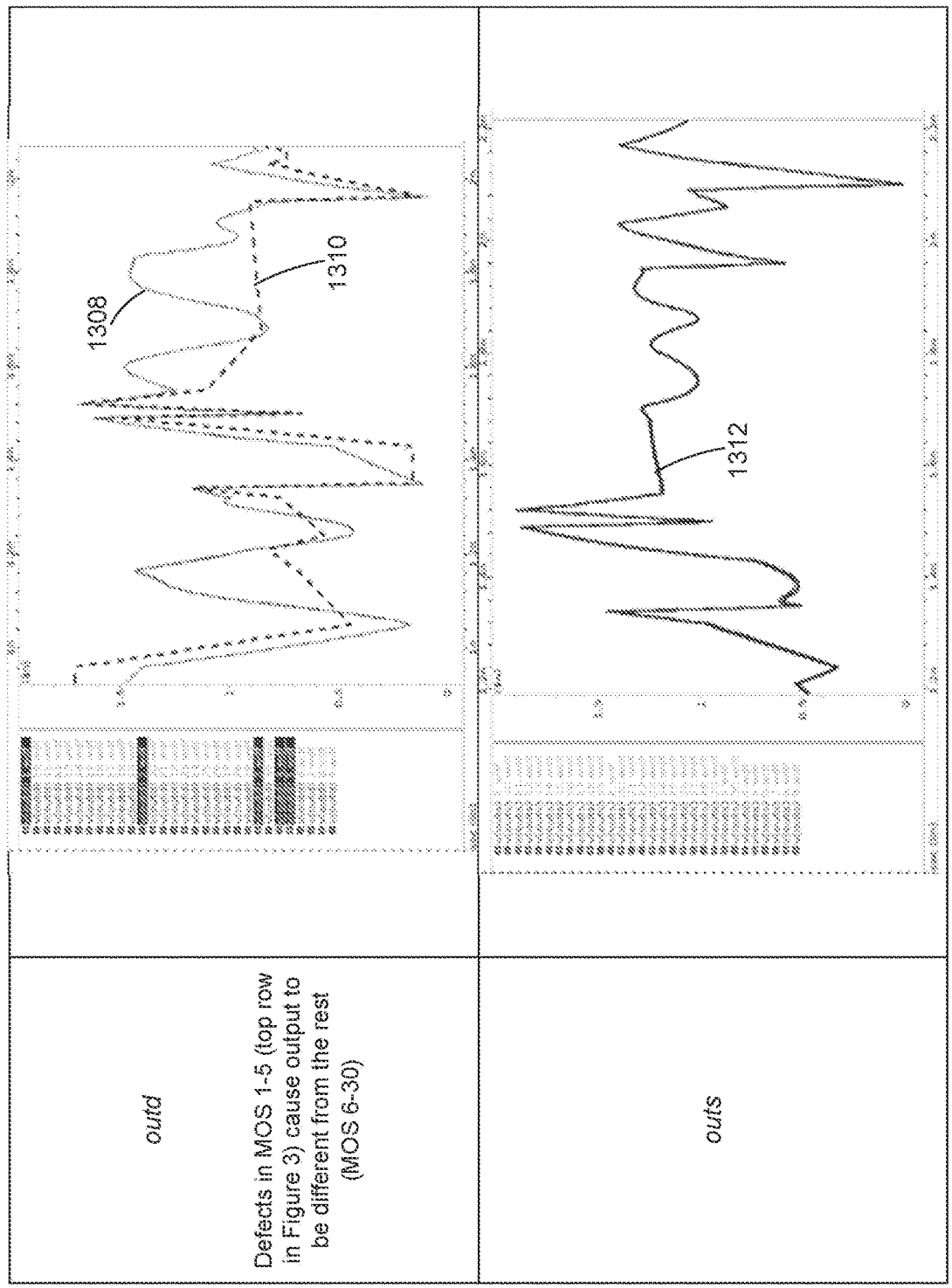
FIG. 13 illustrates output signals for drain-bulk short defects on 30 MOSFETs of a 6*5 stacked MOSFET array, according to some embodiments of the present disclosure.
Figure 14:
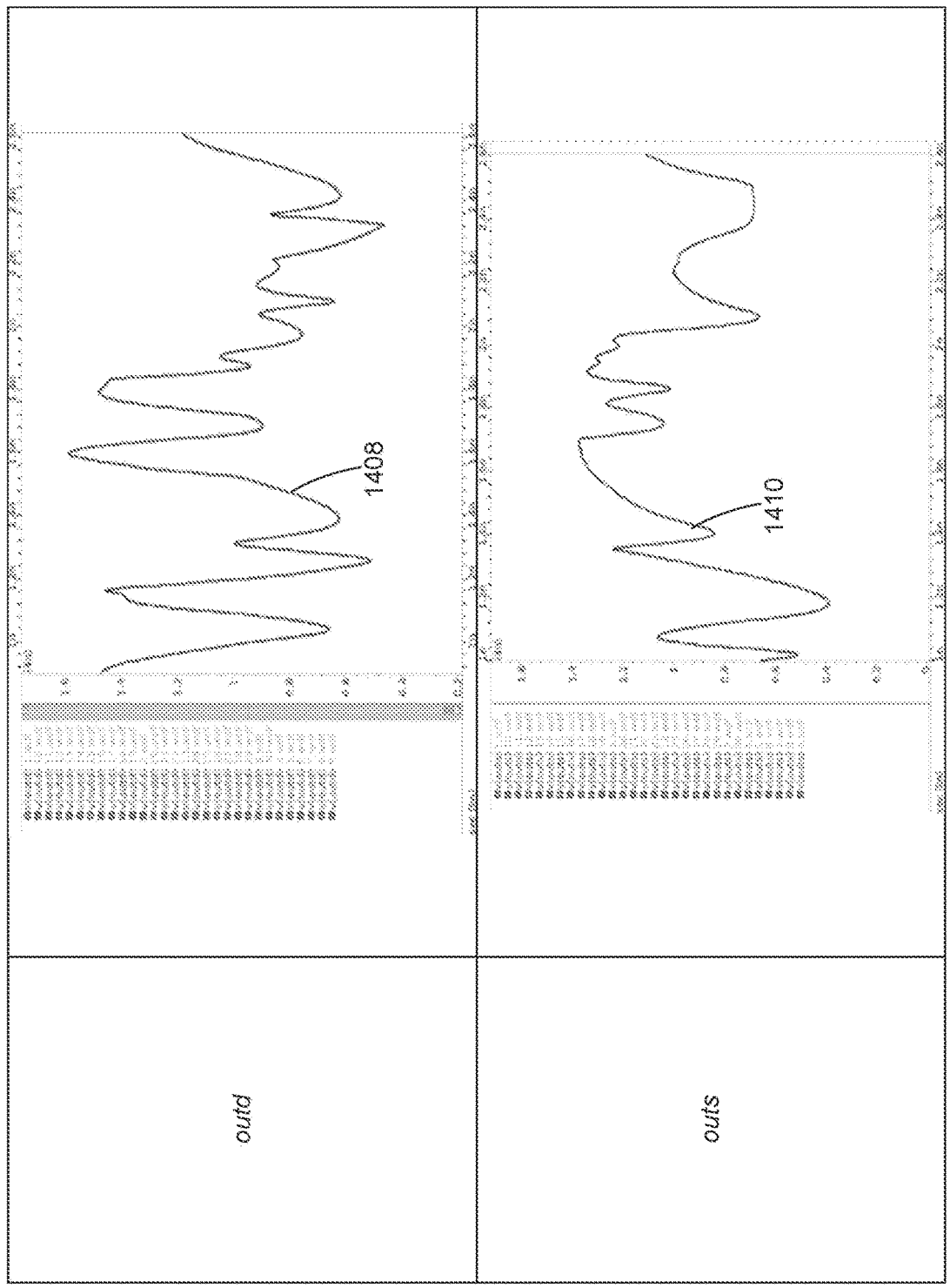
FIG. 14 illustrates output signals for gate-bulk short defects on 30 MOSFETs of a 6*5 stacked MOSFET array, according to some embodiments of the present disclosure.
Figure 15:
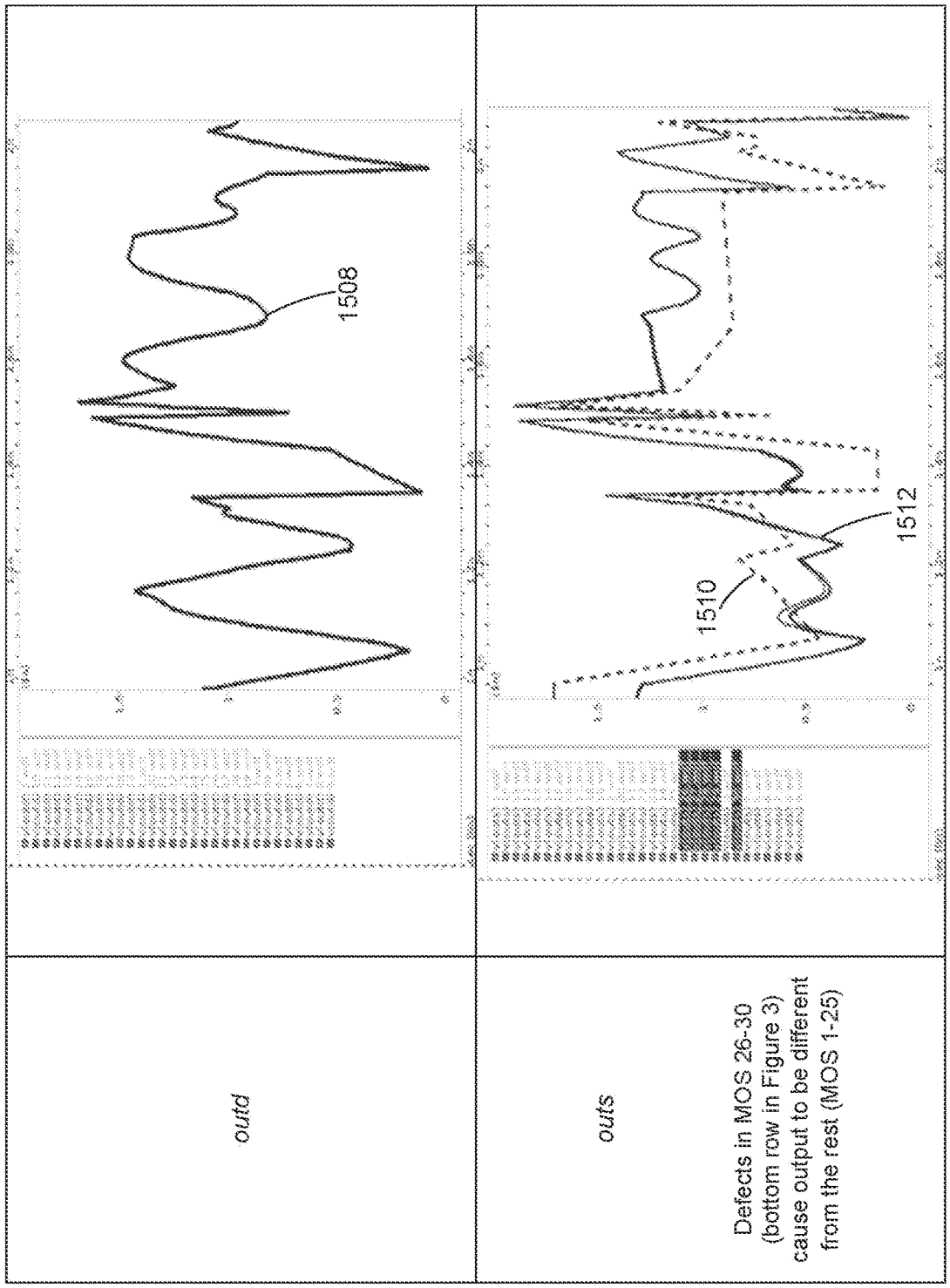
FIG. 15 illustrates output signals for source-bulk short defects on 30 MOSFETs of a 6*5 stacked MOSFET array, according to some embodiments of the present disclosure.

Referring to FIG. 12, profiles 1208 and 1210 can represent two electrically equivalent bulk open defects for MOSFETs 1-30 in stacked MOSFET array 300 at output terminal outd. Profiles 1212 and 1214 can represent two electrically equivalent bulk open defects for MOSFETs 1-30 in stacked MOSFET array 300 at output terminal outs. Referring to FIG. 13, profiles 1308 and 1310 can represent two electrically equivalent drain-bulk short defects for MOSFETs 1-30 in stacked MOSFET array 300 at output terminal outd. Profile 1312 can represent one electrically equivalent drain-bulk short defect for MOSFETs 1-30 in stacked MOSFET array 300 at output terminal outs. Referring to FIG. 14, profile 1408 can represent one electrically equivalent gate-bulk short defect for MOSFETs 1-30 in stacked MOSFET array 300 at output terminal outd. Profile 1410 can represent one electrically equivalent gate-bulk short defect for MOSFETs 1-30 in stacked MOSFET array 300 at output terminal outs. Referring to FIG. 15, profile 1508 can represent one electrically equivalent source-bulk short defect for MOSFETs 1-30 in stacked MOSFET array 300 at output terminal outd. Profiles 1510 and 1512 can represent two electrically equivalent source-bulk short defects for MOSFETs 1-30 in stacked MOSFET array 300 at output terminal outs.

Figure 16:
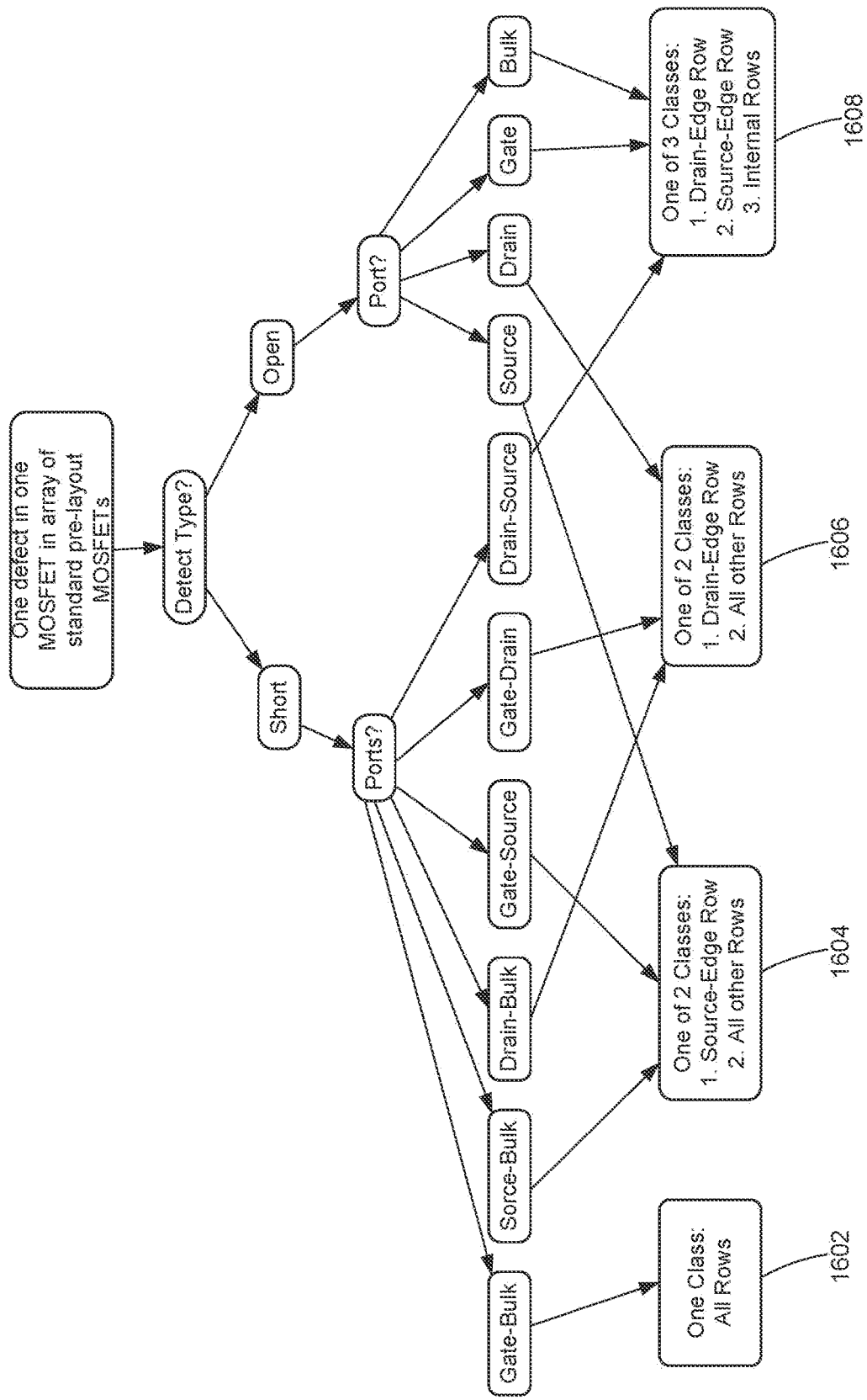
FIG. 16 illustrates a process of finding equivalent class of one defect in a stacked MOSFET array of standard pre-layout MOSFETs, according to some embodiments of the present disclosure.

FIG. 16 illustrates a process of finding equivalent class of one defect in a stacked MOSFET array of standard pre-layout MOSFETs, according to some embodiments of the present disclosure. In some embodiments, FIG. 16 can illustrate a process of equivalence classification for one defect related to gate, drain, source, and bulk terminals in a stacked MOSFET array. Similar to the process in FIG. 11, the defect type of the one defect in the stacked MOSFET array can be identified as a short defect or an open defect. For the short and open defects, the related ports can be identified. The equivalent defect class of a gate-bulk short defect can be illustrated in box 1602. The equivalent defect classes of a source-bulk short defect, a gate-source short defect, and a source open defect can be illustrated in box 1604. The equivalent defect classes of a drain-bulk short defect, a gate-drain short defect, and a drain open defect can be illustrated in box 1606. The equivalent defect classes of a drain-source short defect, a gate open defect, and a bulk open defect can be illustrated in box 1608.

Figure 17:
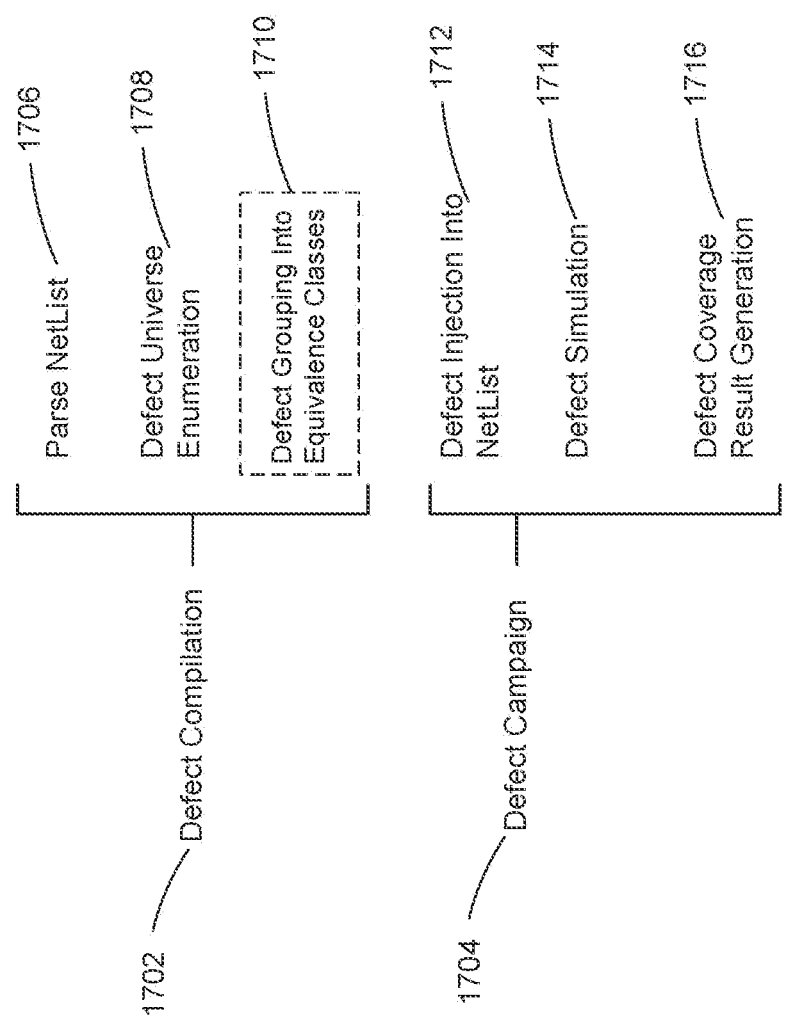
FIG. 17 illustrates a defect coverage calculation flow, according to some embodiments of the present disclosure.

FIG. 17 illustrates a defect coverage calculation flow, according to some embodiments of the present disclosure. In some embodiments, the defect coverage calculation flow can include defect compilation 1702 and defect campaign 1704. Defect compilation 1702 can include parse netlist 1706, defect universe enumeration 1708, and defect grouping into equivalence classes 1710. Defect campaign can include defect injection into netlist 1712, defect simulation 1714, and defect coverage result generation 1716. In some embodiments, defect grouping into equivalence classes 1710 can be significantly improved by finding equivalent defect classes in stacked MOSFET arrays based on topological equivalence and electrical equivalence illustrated in FIGS. 1, 2, 11, and 16.

Figure 18:
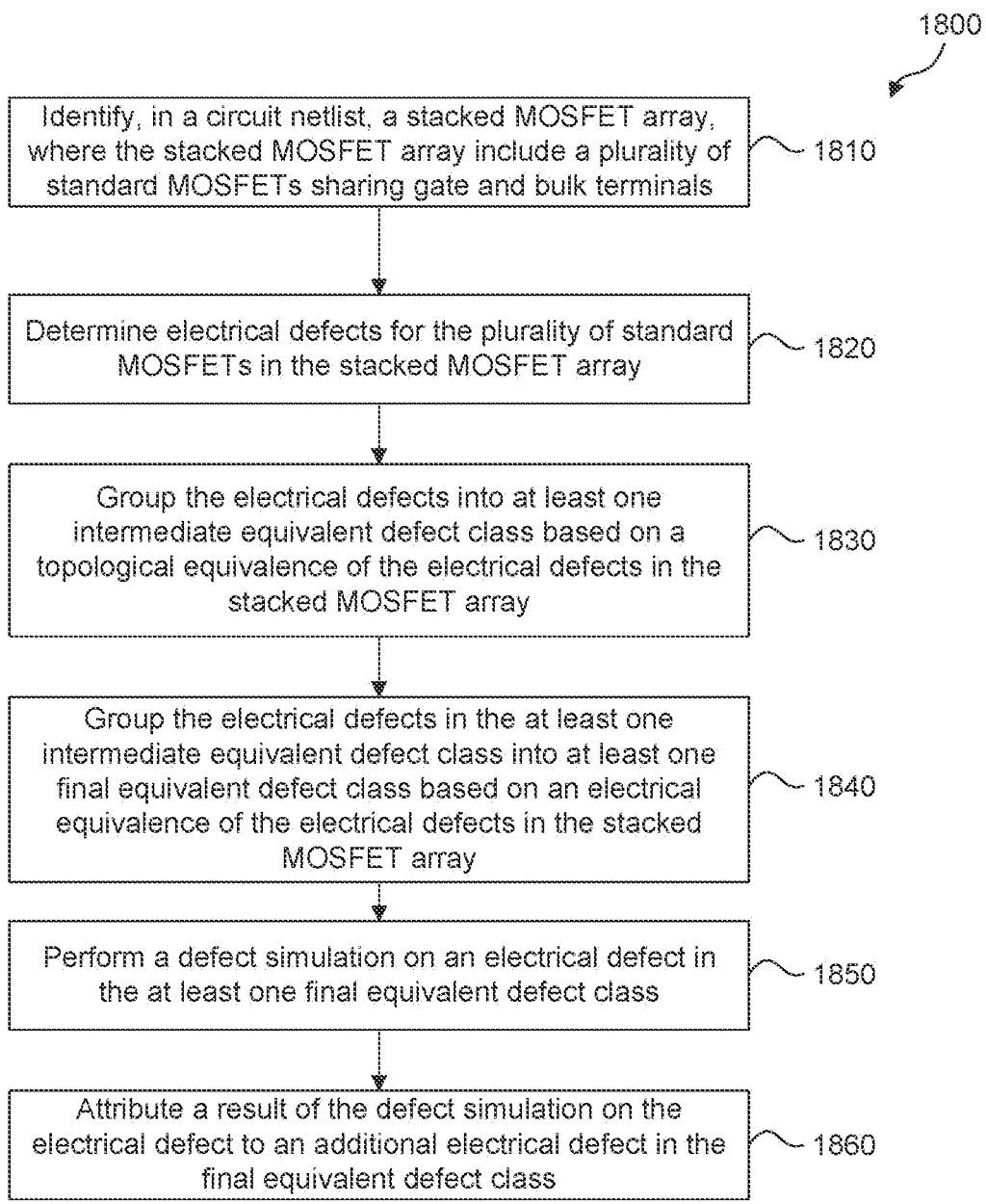
FIG. 18 illustrates a flowchart of a method for finding equivalent classes of hard defects in a stacked MOSFET array, according to some embodiments of the present disclosure.

FIG. 18 illustrates a flowchart of method 1800 for finding equivalent classes of hard defects in a stacked MOSFET array, according to some embodiments of the present disclosure. Additional operations may be performed between various operations of method 1800 and may be omitted merely for clarity and ease of description. Additionally, some of the operations may be performed simultaneously, or in a different order than the ones shown in FIG. 18. Accordingly, it is understood that additional processes can be provided before, during, and/or after method 1800, and that these additional processes can be briefly described herein. For illustrative purposes, the operations illustrated in FIG. 18 can be described with reference to the example layouts, simulations, and processes to find equivalent classes of hard defects in a stacked MOSFET array as illustrated in FIGS. 1-16.

Referring to FIG. 18, at 1810, a stacked MOSFET array is identified in a circuit netlist. The stacked MOSFET array includes multiple standard MOSFETs sharing gate and bulk terminals. For example, as shown in FIGS. 1 and 2, stacked MOSFET array 100 can include M*N standard MOSFETs sharing gate and bulk terminals, such as MOSFETs 102-132. Stacked MOSFET array 300 in FIG. 3 can include 30 standard MOSFETs 1-30 sharing gate and bulk terminals.

Referring to FIG. 18, at 1820, electrical defects for the multiple standard MOSFETs in the stacked MOSFET array are determined. In some embodiments, the electrical defects can include hard defects such as short defects and open defects. For example, as shown in FIG. 1, the arcs between different terminals of the standard MOSFETs in stacked MOSFET array 100 can illustrate short defects between these different terminals. As shown in FIG. 2, the cross at each terminal can represent corresponding open defects at each terminal of the MOSFETs in stacked MOSFET array 100. Each standard MOSFET in stacked MOSFET array 100 can include three short defects of gate-drain, gate-source, and source-drain short defects and three open defects of gate, drain, and source open defects, as shown in FIG. 11. In some embodiments, M*N stacked MOSFET array 100 can include 3M*N short defects and 3M*N open defects. Considering bulk terminals, each standard MOSFET can include six short defects and four open defects, as shown in FIG. 16. The six short defects can include gate-bulk, source-bulk, drain-bulk, gate-drain, gate-source, and drain-source short defects. The four open defects can include bulk, gate, drain, and source open defects.

Referring to FIG. 18, at 1830, the electrical defects are grouped into at least one intermediate equivalent defect class based on a topological equivalence of the electrical defects in the stacked MOSFET array. For example, as shown in FIG. 1, based on the topological equivalence of the short defects, 3M*N short defects in stacked MOSFET array 100 can be reduced to 2M+1 equivalent short defect classes. As shown in FIG. 2, based on the topological equivalence of the open defects, 3M*N open defects in stacked MOSFET array 100 can be reduced to 2M+1 equivalent open defect classes.

Referring to FIG. 18, at 1840, the electrical defects in the at least one intermediate equivalent defect class are grouped into at least one final equivalent defect class based on an electrical equivalence of the electrical defects in the stacked MOSFET array. For example, as shown in FIGS. 5-16, open defects and short defects can be grouped into final equivalent defect classes based on a location of the electrical defects in an edge row of the stacked MOSFET array. For example, as shown in FIGS. 10, 11, and 16, drain-source short defects for all 30 MOSFETs in stacked MOSFET array 300 can have three final equivalent drain-source short defect classes: in the drain-edge row, in the source-edge row, and in the internal rows of the stacked MOSFET array 300.

Referring to FIG. 18, at 1850, a defect simulation is performed on an electrical defect in the at least one final equivalent defect class. For example, as shown in FIGS. 5-10 and 12-15, defect simulations can be performed on MOSFET 1-30 in stacked MOSFET array 300. The defect simulations for all MOSFETs in one final equivalent defect class can have a same simulation result. For example, as shown in FIG. 5, output signals at output terminal outd for drain open defects of MOSFET 1-5 can have a same profile 508. Output signals at output terminal outd for drain open defects of MOSFET 6-30 can have a same profile 510. Output signals at output terminal outs for drain open defects of MOSFET 1-30 can have a same profile 512.

Referring to FIG. 18, at 1860, a result of the defect simulation on the electrical defect is attributed to an additional electrical defect in the final equivalent defect class. For example, as shown in FIG. 5, profile 508 can represent the simulation result for drain open defect of MOSFET 1 at output terminal outd. According to the simulation results in FIG. 5, profile 508 can be attributed to the simulation results for drain open defects of MOSFETs 2-5 at output terminal outd.

In some embodiments, method 1800 can identify equivalent defect classes of hard defects in MOSFETs of a stacked MOSFET array having standard MOSFETs in a circuit netlist. In some embodiments, the standard MOSFETs can share a common specification and can be physically and electronically identical. In some embodiments, the standard MOSFETs can be basic minimum-sized MOSFETs in the circuit netlist. In some embodiments, if the MOSFETs in a MOSFET array are similar but not identical and the parasitic resistance and capacitance in the MOSFET array are much less (e.g., less than about 1%) than the resistance and capacitance of the MOSFETs, method 1800 may also identify equivalent defects classes of hard defects in the MOSFETs. With identification of topological and electrical equivalent defect classes for an M*N MOSFET array, the total number of defect simulations can be significantly reduced from an order of O(M*N) to an order of O(1). The defect coverage calculation for defect simulations on one defect for each topological and electrical equivalent defect class can be the same as extensive defect simulations of all defects in every MOSFET of the M*N MOSFET array.

Figure 19:
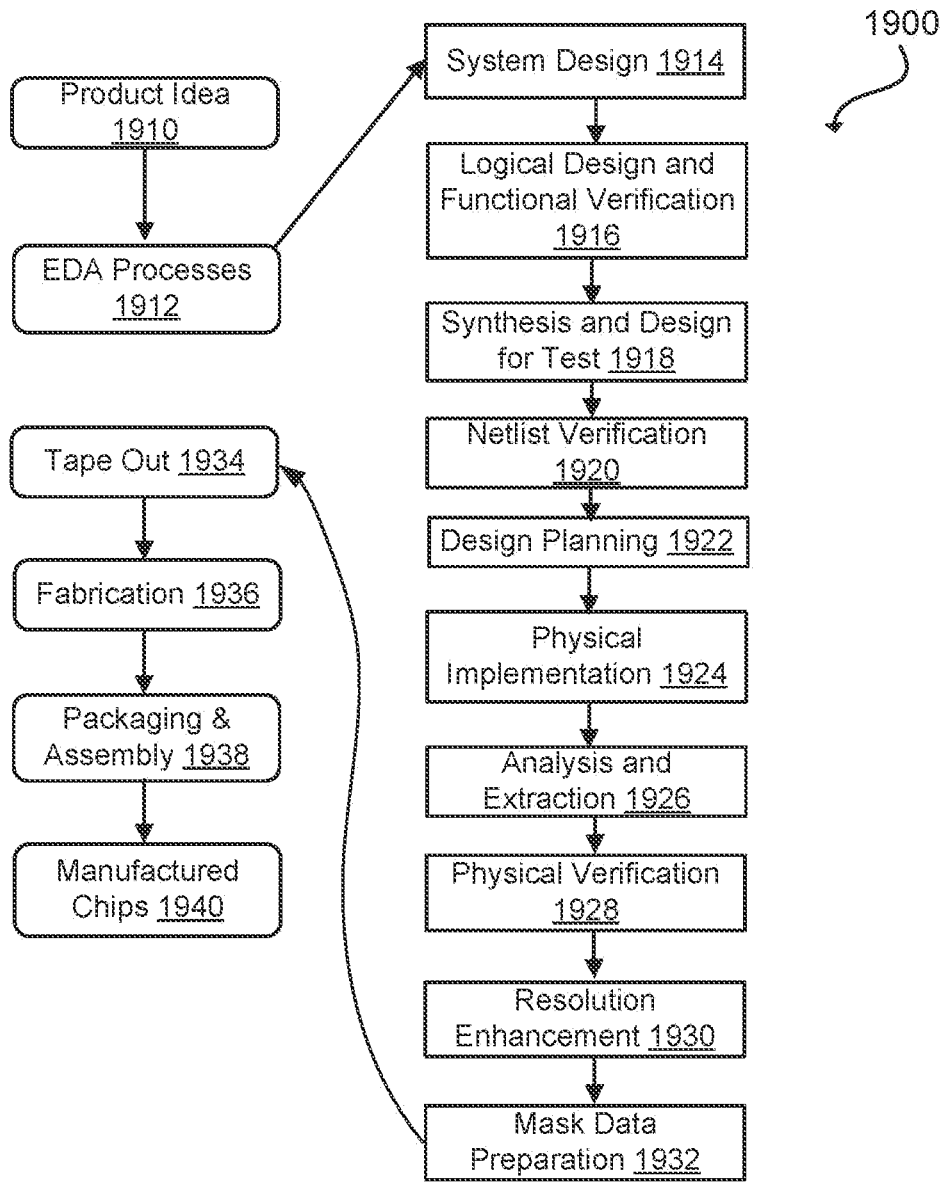
FIG. 19 depicts a flowchart of various processes used during the design and manufacture of an integrated circuit in accordance with some embodiments of the present disclosure.

FIG. 19 illustrates an example set of processes 1900 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1910 with information supplied by a designer, information which is transformed to create an article of manufacture that uses a set of EDA processes 1912. When the design is finalized, the design is taped-out 1934, which is when artwork (e.g., geometric patterns) for the integrated circuit is sent to a fabrication facility to manufacture the mask set, which is then used to manufacture the integrated circuit. After tape-out, a semiconductor die is fabricated 1936 and packaging and assembly processes 1938 are performed to produce the finished integrated circuit 1940.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 19. The processes described by be enabled by EDA products (or tools).

During system design 1914, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1916, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1918, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1920, the netlist is checked for compliance with timing constraints and for correspondence with the HDL code. During design planning 1922, an overall floor plan for the integrated circuit is constructed and analyzed for timing and top-level routing.

During layout or physical implementation 1924, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1926, the circuit function is verified at the layout level, which permits refinement of the layout design. During physical verification 1928, the layout design is checked to ensure that manufacturing constraints are correct, such as DRC constraints, electrical constraints, lithographic constraints, and that circuitry function matches the HDL design specification. During resolution enhancement 1930, the geometry of the layout is transformed to improve how the circuit design is manufactured.

During tape-out, data is created to be used (after lithographic enhancements are applied if appropriate) for production of lithography masks. During mask data preparation 1932, the 'tape-out' data is used to produce lithography masks that are used to produce finished integrated circuits.

A storage subsystem of a computer system (such as computer system 2100 of FIG. 21, or host system 2007 of FIG. 20) may be used to store the programs and data structures that are used by some or all of the EDA products described herein, and products used for development of cells for the library and for physical and logical design that use the library.

Figure 20:
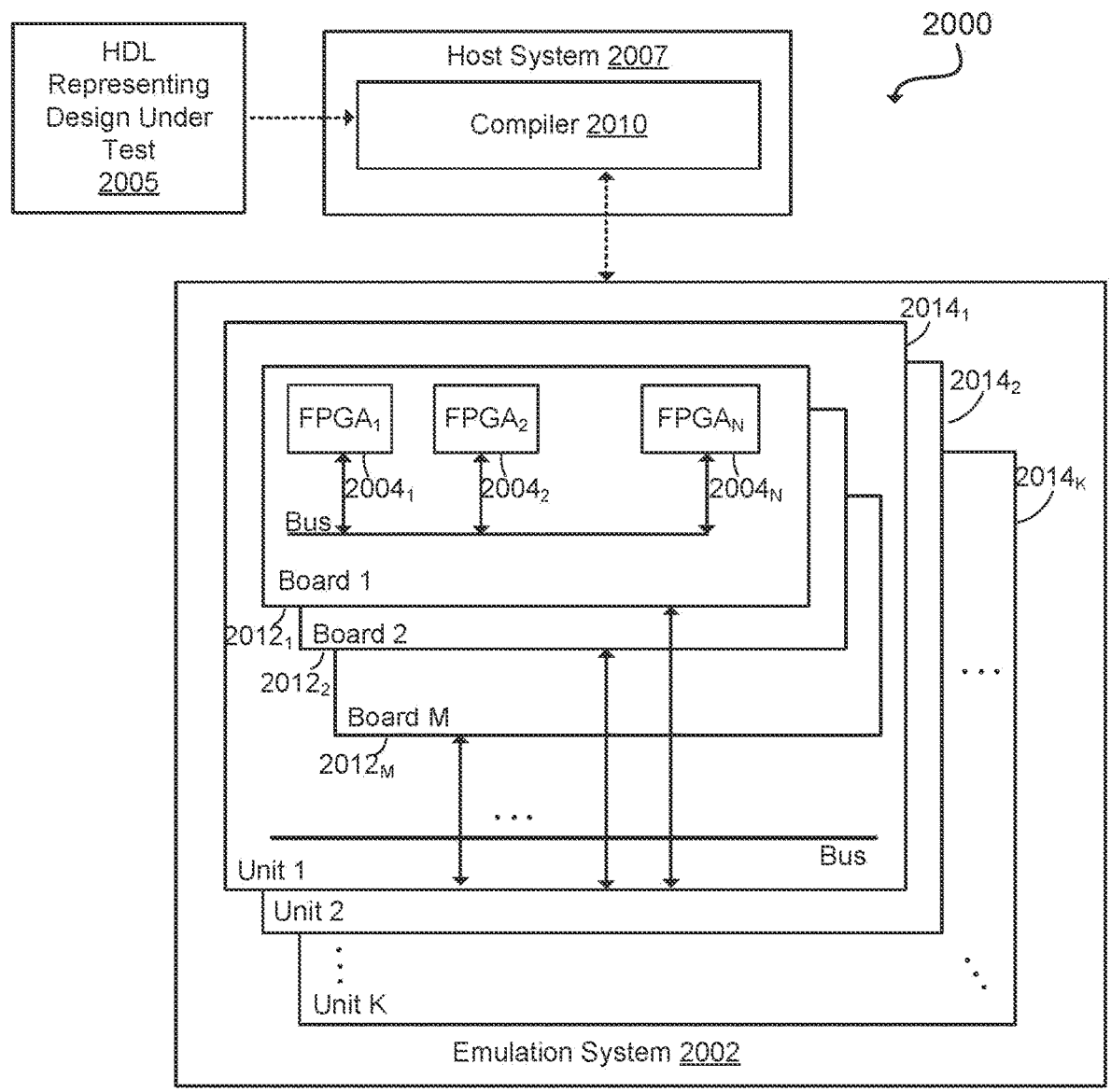
FIG. 20 depicts an abstract diagram of an example emulation system in accordance with some embodiments of the present disclosure.

FIG. 20 depicts an abstract diagram of an example emulation environment 2000. An emulation environment 2000 may be configured to verify the functionality of the circuit design. The emulation environment 2000 may include a host system 2007 (e.g., a computer that is part of an EDA system) and an emulation system 2002 (e.g., a set of programmable devices such as Field Programmable Gate Arrays (FPGAs) or processors). The host system generates data and information by using a compiler 2010 to structure the emulation system to emulate a circuit design. A circuit design to be emulated is also referred to as a Design Under Test ('DUT') where data and information from the emulation are used to verify the functionality of the DUT.

The host system 2007 may include one or more processors. In the embodiment where the host system includes multiple processors, the functions described herein as being performed by the host system can be distributed among the multiple processors. The host system 2007 may include a compiler 2010 to transform specifications written in a description language that represents a DUT and to produce data (e.g., binary data) and information that is used to structure the emulation system 2002 to emulate the DUT. The compiler 2010 can transform, change, restructure, add new functions to, and/or control the timing of the DUT.

The host system 2007 and emulation system 2002 exchange data and information using signals carried by an emulation connection. The connection can be, but is not limited to, one or more electrical cables such as cables with pin structures compatible with the Recommended Standard 232 (RS232) or universal serial bus (USB) protocols. The connection can be a wired communication medium or network such as a local area network or a wide area network such as the Internet. The connection can be a wireless communication medium or a network with one or more points of access using a wireless protocol such as BLUETOOTH or IEEE 1402.11. The host system 2007 and emulation system 2002 can exchange data and information through a third device such as a network server.

The emulation system 2002 includes multiple FPGAs (or other modules) such as FPGAs $2004_1$ and $2004_2$ as well as additional FPGAs to $2004_N$. Each FPGA can include one or more FPGA interfaces through which the FPGA is connected to other FPGAs (and potentially other emulation components) for the FPGAs to exchange signals. An FPGA interface can be referred to as an input/output pin or an FPGA pad. While an emulator may include FPGAs, embodiments of emulators can include other types of logic blocks instead of, or along with, the FPGAs for emulating DUTs. For example, the emulation system 2002 can include custom FPGAs, specialized ASICs for emulation or prototyping, memories, and input/output devices.

A programmable device can include an array of programmable logic blocks and a hierarchy of interconnections that can enable the programmable logic blocks to be interconnected according to the descriptions in the HDL code. Each of the programmable logic blocks can enable complex combinational functions or enable logic gates such as AND, and XOR logic blocks. In some embodiments, the logic blocks also can include memory elements/devices, which can be simple latches, flip-flops, or other blocks of memory. Depending on the length of the interconnections between different logic blocks, signals can arrive at input terminals of the logic blocks at different times and thus may be temporarily stored in the memory elements/devices.

FPGAs $2004_1$-$2004_N$ may be placed onto one or more boards $2012_1$ and $2012_2$ as well as additional boards through $2012_M$. Multiple boards can be placed into an emulation unit $2014_1$. The boards within an emulation unit can be connected using the backplane of the emulation unit or any other types of connections. In addition, multiple emulation units (e.g., $2014_1$ and $2014_2$ through $2014_K$) can be connected to each other by cables or any other means to form a multi-emulation unit system.

For a DUT that is to be emulated, the host system 2007 transmits one or more bit files to the emulation system 2002. The bit files may specify a description of the DUT and may further specify partitions of the DUT created by the host system 2007 with trace and injection logic, mappings of the partitions to the FPGAs of the emulator, and design constraints. Using the bit files, the emulator structures the FPGAs to perform the functions of the DUT. In some embodiments, one or more FPGAs of the emulators may have the trace and injection logic built into the silicon of the FPGA. In such an embodiment, the FPGAs may not be structured by the host system to emulate trace and injection logic.

The host system 2007 receives a description of a DUT that is to be emulated. In some embodiments, the DUT description is in a description language (e.g., a register transfer language (RTL)). In some embodiments, the DUT description is in netlist level files or a mix of netlist level files and HDL files. If part of the DUT description or the entire DUT description is in an HDL, then the host system can synthesize the DUT description to create a gate level netlist using the DUT description. A host system can use the netlist of the DUT to partition the DUT into multiple partitions where one or more of the partitions include trace and injection logic. The trace and injection logic traces interface signals that are exchanged via the interfaces of an FPGA. Additionally, the trace and injection logic can inject traced interface signals into the logic of the FPGA. The host system maps each partition to an FPGA of the emulator. In some embodiments, the trace and injection logic is included in select partitions for a group of FPGAs. The trace and injection logic can be built into one or more of the FPGAs of an emulator. The host system can synthesize multiplexers to be mapped into the FPGAs. The multiplexers can be used by the trace and injection logic to inject interface signals into the DUT logic.

The host system creates bit files describing each partition of the DUT and the mapping of the partitions to the FPGAs. For partitions in which trace and injection logic are included, the bit files also describe the logic that is included. The bit files can include place and route information and design constraints. The host system stores the bit files and information describing which FPGAs are to emulate each component of the DUT (e.g., to which FPGAs each component is mapped).

Upon request, the host system transmits the bit files to the emulator. The host system signals the emulator to start the emulation of the DUT. During emulation of the DUT or at the end of the emulation, the host system receives emulation results from the emulator through the emulation connection. Emulation results are data and information generated by the emulator during the emulation of the DUT which include interface signals and states of interface signals that have been traced by the trace and injection logic of each FPGA. The host system can store the emulation results and/or transmits the emulation results to another processing system.

After emulation of the DUT, a circuit designer can request to debug a component of the DUT. If such a request is made, the circuit designer can specify a time period of the emulation to debug. The host system identifies which FPGAs are emulating the component using the stored information. The host system retrieves stored interface signals associated with the time period and traced by the trace and injection logic of each identified FPGA. The host system signals the emulator to re-emulate the identified FPGAs. The host system transmits the retrieved interface signals to the emulator to re-emulate the component for the specified time period. The trace and injection logic of each identified FPGA injects its respective interface signals received from the host system into the logic of the DUT mapped to the FPGA. In case of multiple re-emulations of an FPGA, merging the results produces a full debug view.

The host system receives, from the emulation system, signals traced by logic of the identified FPGAs during the re-emulation of the component. The host system stores the signals received from the emulator. The signals traced during the re-emulation can have a higher sampling rate than the sampling rate during the initial emulation. For example, in the initial emulation a traced signal can include a saved state of the component every X milliseconds. However, in the re-emulation the traced signal can include a saved state every Y milliseconds where Y is less than X. If the circuit designer requests to view a waveform of a signal traced during the re-emulation, the host system can retrieve the stored signal and display a plot of the signal. For example, the host system can generate a waveform of the signal. Afterwards, the circuit designer can request to re-emulate the same component for a different time period or to re-emulate another component.

A host system 2007 and/or the compiler 2010 may include sub-systems such as, but not limited to, a design synthesizer sub-system, a mapping sub-system, a run time sub-system, a results sub-system, a debug sub-system, a waveform sub-system, and a storage sub-system. The sub-systems can be structured and enabled as individual or multiple modules or two or more may be structured as a module. Together these sub-systems structure the emulator and monitor the emulation results.

The design synthesizer sub-system transforms the HDL that is representing a DUT 2005 into gate level logic. For a DUT that is to be emulated, the design synthesizer sub-system receives a description of the DUT. If the description of the DUT is fully or partially in HDL (e.g., RTL or other level of abstraction), the design synthesizer sub-system synthesizes the HDL of the DUT to create a gate-level netlist with a description of the DUT in terms of gate level logic.

The mapping sub-system partitions DUTs and maps the partitions into emulator FPGAs. The mapping sub-system partitions a DUT at the gate level into a number of partitions using the netlist of the DUT. For each partition, the mapping sub-system retrieves a gate level description of the trace and injection logic and adds the logic to the partition. As described above, the trace and injection logic included in a partition is used to trace signals exchanged via the interfaces of an FPGA to which the partition is mapped (trace interface signals). The trace and injection logic can be added to the DUT prior to the partitioning. For example, the trace and injection logic can be added by the design synthesizer sub-system prior to or after the synthesizing the HDL of the DUT.

In addition to including the trace and injection logic, the mapping sub-system can include additional tracing logic in a partition to trace the states of certain DUT components that are not traced by the trace and injection. The mapping sub-system can include the additional tracing logic in the DUT prior to the partitioning or in partitions after the partitioning. The design synthesizer sub-system can include the additional tracing logic in an HDL description of the DUT prior to synthesizing the HDL description.

The mapping sub-system maps each partition of the DUT to an FPGA of the emulator. For partitioning and mapping, the mapping sub-system uses design rules, design constraints (e.g., timing or logic constraints), and information about the emulator. For components of the DUT, the mapping sub-system stores information in the storage sub-system describing which FPGAs are to emulate each component.

Using the partitioning and the mapping, the mapping sub-system generates one or more bit files that describe the created partitions and the mapping of logic to each FPGA of the emulator. The bit files can include additional information such as constraints of the DUT and routing information of connections between FPGAs and connections within each FPGA. The mapping sub-system can generate a bit file for each partition of the DUT and can store the bit file in the storage sub-system. Upon request from a circuit designer, the mapping sub-system transmits the bit files to the emulator, and the emulator can use the bit files to structure the FPGAs to emulate the DUT.

If the emulator includes specialized ASICs that include the trace and injection logic, the mapping sub-system can generate a specific structure that connects the specialized ASICs to the DUT. In some embodiments, the mapping sub-system can save the information of the traced/injected signal and where the information is stored on the specialized ASIC.

The run time sub-system controls emulations performed by the emulator. The run time sub-system can cause the emulator to start or stop executing an emulation. Additionally, the run time sub-system can provide input signals and data to the emulator. The input signals can be provided directly to the emulator through the connection or indirectly through other input signal devices. For example, the host system can control an input signal device to provide the input signals to the emulator. The input signal device can be, for example, a test board (directly or through cables), signal generator, another emulator, or another host system.

The results sub-system processes emulation results generated by the emulator. During emulation and/or after completing the emulation, the results sub-system receives emulation results from the emulator generated during the emulation. The emulation results include signals traced during the emulation. Specifically, the emulation results include interface signals traced by the trace and injection logic emulated by each FPGA and can include signals traced by additional logic included in the DUT. Each traced signal can span multiple cycles of the emulation. A traced signal includes multiple states and each state is associated with a time of the emulation. The results sub-system stores the traced signals in the storage sub-system. For each stored signal, the results sub-system can store information indicating which FPGA generated the traced signal.

The debug sub-system allows circuit designers to debug DUT components. After the emulator has emulated a DUT and the results sub-system has received the interface signals traced by the trace and injection logic during the emulation, a circuit designer can request to debug a component of the DUT by re-emulating the component for a specific time period. In a request to debug a component, the circuit designer identifies the component and indicates a time period of the emulation to debug. The circuit designer's request can include a sampling rate that indicates how often states of debugged components should be saved by logic that traces signals.

The debug sub-system identifies one or more FPGAs of the emulator that are emulating the component using the information stored by the mapping sub-system in the storage sub-system. For each identified FPGA, the debug sub-system retrieves, from the storage sub-system, interface signals traced by the trace and injection logic of the FPGA during the time period indicated by the circuit designer. For example, the debug sub-system retrieves states traced by the trace and injection logic that are associated with the time period.

The debug sub-system transmits the retrieved interface signals to the emulator. The debug sub-system instructs the debug sub-system to use the identified FPGAs and for the trace and injection logic of each identified FPGA to inject its respective traced signals into logic of the FPGA to re-emulate the component for the requested time period. The debug sub-system can further transmit the sampling rate provided by the circuit designer to the emulator so that the tracing logic traces states at the proper intervals.

To debug the component, the emulator can use the FPGAs to which the component has been mapped. Additionally, the re-emulation of the component can be performed at any point specified by the circuit designer.

For an identified FPGA, the debug sub-system can transmit instructions to the emulator to load multiple emulator FPGAs with the same configuration of the identified FPGA. The debug sub-system additionally signals the emulator to use the multiple FPGAs in parallel. Each FPGA from the multiple FPGAs is used with a different time window of the interface signals to generate a larger time window in a shorter amount of time. For example, the identified FPGA can require an hour or more to use a certain amount of cycles. However, if multiple FPGAs have the same data and structure of the identified FPGA and each of these FPGAs runs a subset of the cycles, the emulator can require a few minutes for the FPGAs to collectively use all the cycles.

A circuit designer can identify a hierarchy or a list of DUT signals to re-emulate. To enable this, the debug sub-system determines the FPGA needed to emulate the hierarchy or list of signals, retrieves the necessary interface signals, and transmits the retrieved interface signals to the emulator for re-emulation. Thus, a circuit designer can identify any element (e.g., component, device, or signal) of the DUT to debug/re-emulate.

The waveform sub-system generates waveforms using the traced signals. If a circuit designer requests to view a waveform of a signal traced during an emulation run, the host system retrieves the signal from the storage sub-system. The waveform sub-system displays a plot of the signal. For one or more signals, when the signals are received from the emulator, the waveform sub-system can automatically generate the plots of the signals.

Figure 21:
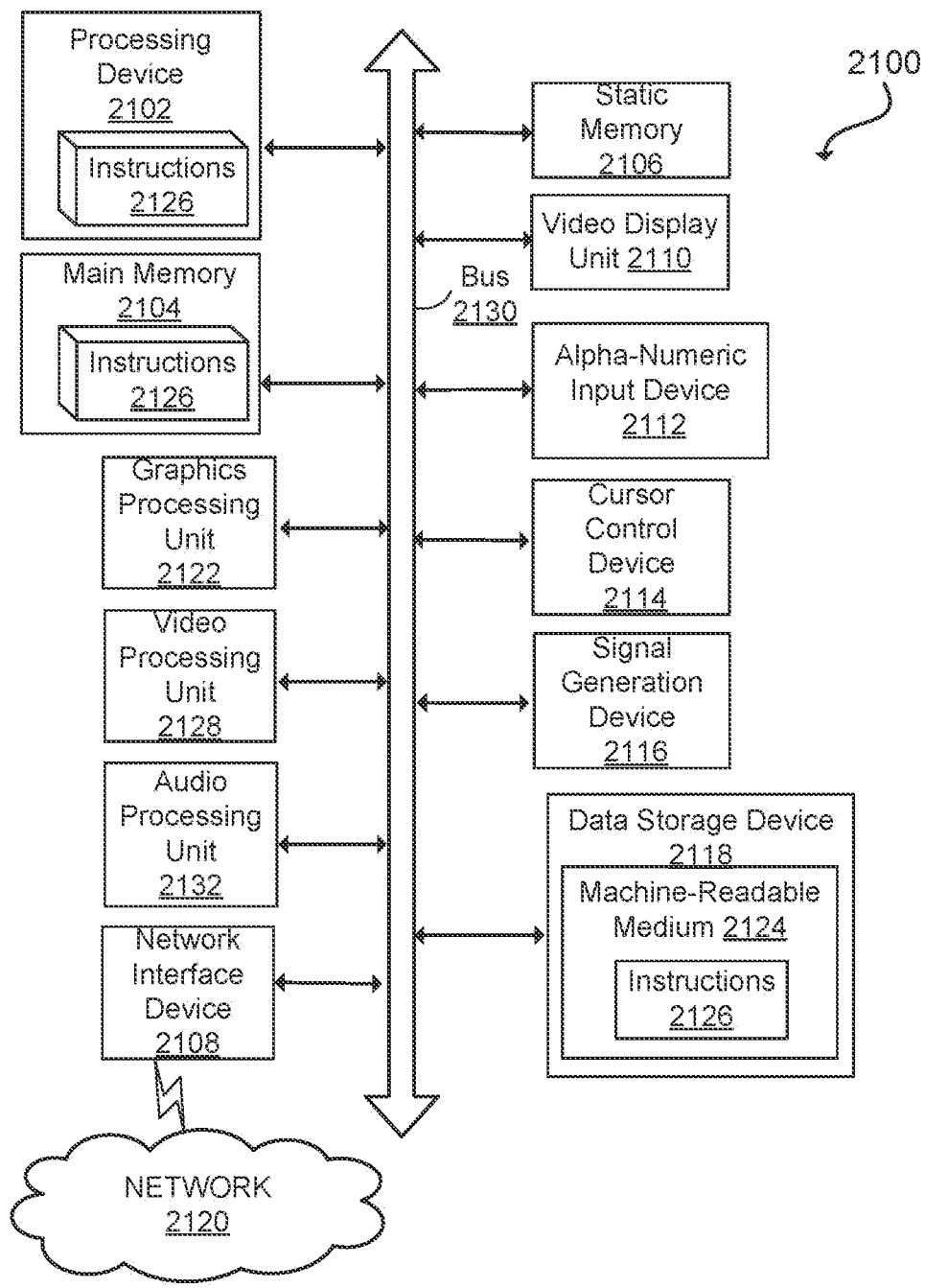
FIG. 21 depicts an abstract diagram of an example computer system in which embodiments of the present disclosure may operate.

FIG. 21 illustrates an example machine of a computer system 2100 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 2100 includes a processing device 2102, a main memory 2104 (e.g., read-only memory (ROM), flash memory, dynamic random access memory (DRAM) such as synchronous DRAM (SDRAM), a static memory 2106 (e.g., flash memory, static random access memory (SRAM), etc.), and a data storage device 2118, which communicate with each other via a bus 2130.

Processing device 2102 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 2102 may also be one or more special-purpose processing devices such as an application specific integrated circuit (ASIC), a field programmable gate array (FPGA), a digital signal processor (DSP), network processor, or the like. The processing device 2102 may be configured to execute instructions 2126 for performing the operations and steps described herein.

The computer system 2100 may further include a network interface device 2108 to communicate over the network 2120. The computer system 2100 also may include a video display unit 2110 (e.g., a liquid crystal display (LCD) or a cathode ray tube (CRT)), an alphanumeric input device 2112 (e.g., a keyboard), a cursor control device 2114 (e.g., a mouse), a graphics processing unit 2122, a signal generation device 2116 (e.g., a speaker), graphics processing unit 2122, video processing unit 2128, and audio processing unit 2132.

The data storage device 2118 may include a machine-readable storage medium 2124 (also known as a non-transitory computer-readable medium) on which is stored one or more sets of instructions 2126 or software embodying any one or more of the methodologies or functions described herein. The instructions 2126 may also reside, completely or at least partially, within the main memory 2104 and/or within the processing device 2102 during execution thereof by the computer system 2100, the main memory 2104 and the processing device 2102 also constituting machine-readable storage media.

In some implementations, the instructions 2126 include instructions to implement functionality corresponding to the present disclosure. While the machine-readable storage medium 2124 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 2102 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method, comprising:
   identifying, in a circuit netlist, a transistor array comprising a plurality of transistor sharing gate and bulk terminals;
   determining electrical defects for the plurality of transistors in the transistor array;
   grouping the electrical defects into a hierarchy of defect classes based on a topological equivalence and an electrical equivalence of the electrical defects in the transistor array; and
   performing, by a processor, a defect simulation on an electrical defect in the hierarchy of defect classes.

2. The method of claim 1, wherein determining the electrical defects comprises determining a number of open defects and a number of short defects.

3. The method of claim 1, wherein the transistor array comprises a stacked MOSFET array, and wherein identifying the transistor array comprises determining a stack index for the stacked MOSFET array.

4. The method of claim 1, wherein grouping the electrical defects into the hierarchy of defect classes based on the topological equivalence comprises grouping the electrical defects related to same terminals in the transistor array into at least one intermediate equivalent defect class.

5. The method of claim 1, wherein grouping the electrical defects into the hierarchy of defect classes based on the electrical equivalence comprises:
   grouping short defects of the electrical defects related to same terminals in the transistor array based on a location of the short defects in an edge row of the transistor array; and
   grouping open defects of the electrical defects related to same terminals in the transistor array based on a location of the open defects in an edge row of the transistor array.

6. The method of claim 1, wherein grouping the electrical defects into the hierarchy of defect classes based on the electrical equivalence comprises grouping the electrical defects based on a location of the electrical defects in an edge row of the transistor array.

7. The method of claim 6, wherein grouping the electrical defects based on the location of the electrical defects comprises:
   grouping gate-drain and drain-bulk short defects of the electrical defects into two final equivalent defect classes based on a location of the gate-drain and drain-bulk short defects in an edge row of drain terminals in the transistor array; and
   grouping drain open defects of the electrical defects into the two final equivalent defect classes based on a location of the drain open defects in the edge row of the drain terminals in the transistor array.

8. The method of claim 6, wherein grouping the electrical defects based on the location of the electrical defects comprises:
   grouping gate-source and source-bulk short defects of the electrical defects into two final equivalent defect classes based on a location of the gate-source and source-bulk short defects in an edge row of source terminals in the transistor array; and
   grouping source open defects of the electrical defects into the two final equivalent defect classes based on a location of the source open defects in the edge row of the source terminals in the transistor array.

9. The method of claim 6, wherein grouping the electrical defects based on the location of the electrical defects comprises:
   grouping drain-source short defects of the electrical defects into three final equivalent defect classes based on a location of the drain-source short defects in an edge row of source terminals or in an edge row of drain terminals of the transistor array; and
   grouping gate open and bulk open defects of the electrical defects into the three final equivalent defect classes based on a location of the gate open and bulk open defects in the edge row of the source terminals or in the edge row of the drain terminals of the transistor array.

10. The method of claim 6, wherein grouping the electrical defects based on the location of the electrical defects comprises grouping gate-bulk short defects of the electrical defects into one final equivalent defect class for the transistor array.

11. A system, comprising:
    a memory storing instructions; and
    a processor, coupled with the memory and to execute the instructions, the instructions when executed cause the processor to:
       identify, in a circuit netlist, a transistor array comprising a plurality of transistor sharing gate and bulk terminals;
       determine electrical defects for the plurality of transistors in the transistor array;
       group the electrical defects into a hierarchy of defect classes based on at least one of a topological equivalence or an electrical equivalence of the electrical defects in the transistor array; and perform a defect simulation on an electrical defect in the hierarchy of defect classes.

12. The system of claim 11, wherein to determine the electrical defects, the instructions cause the processor to determine a number of open defects and a number of short defects.

13. The system of claim 11, wherein the transistor array comprises a stacked MOSFET array, and wherein to identify the transistor array, the instructions cause the processor to determine a stack index for the stacked MOSFET array.

14. The system of claim 11, wherein grouping the electrical defects into the hierarchy of defect classes based on the topological equivalence comprises grouping the electrical defects related to same terminals in the transistor array into at least one intermediate equivalent defect class.

15. The system of claim 11, wherein grouping the electrical defects into the hierarchy of defect classes based on the electrical equivalence comprises grouping the electrical defects based on a location of the electrical defects in an edge row of the transistor array.

16. A non-transitory computer readable storage medium comprising stored instructions, which when executed by a processor, cause the processor to:

identify, in a circuit netlist, a transistor array comprising a plurality of transistor sharing gate and bulk terminals;

determine electrical defects for the plurality of transistors in the transistor array;

group the electrical defects into a hierarchy of defect classes based on at least one of a topological equivalence or an electrical equivalence of the electrical defects in the transistor array; and perform a defect simulation on an electrical defect in the hierarchy of defect classes.

17. The non-transitory computer readable storage medium of claim 16, wherein to determine the electrical defects, the instructions cause the processor to determine a number of open defects and a number of short defects.

18. The non-transitory computer readable storage medium of claim 16, wherein the transistor array comprises a stacked MOSFET array, and wherein to identify the transistor array, the instructions cause the processor to determine a stack index for the stacked MOSFET array.

19. The non-transitory computer readable storage medium of claim 16, wherein grouping the electrical defects into the hierarchy of defect classes based on the topological equivalence comprises grouping the electrical defects related to same terminals in the transistor array into at least one intermediate equivalent defect class.

20. The non-transitory computer readable storage medium of claim 16, wherein grouping the electrical defects into the hierarchy of defect classes based on the electrical equivalence comprises grouping the electrical defects based on a location of the electrical defects in an edge row of the transistor array.

* * * * *